US011469160B2

(12) United States Patent
Tsuyuno et al.

(10) Patent No.: US 11,469,160 B2
(45) Date of Patent: Oct. 11, 2022

(54) POWER MODULE WITH ACTIVE ELEMENTS AND INTERMEDIATE ELECTRODE THAT CONNECTS CONDUCTORS

(71) Applicant: HITACHI AUTOMOTIVE SYSTEMS, LTD., Hitachinaka (JP)

(72) Inventors: Nobutake Tsuyuno, Tokyo (JP); Takashi Hirao, Tokyo (JP); Akira Matsushita, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 17/254,558

(22) PCT Filed: Jun. 19, 2019

(86) PCT No.: PCT/JP2019/024210
§ 371 (c)(1),
(2) Date: Dec. 21, 2020

(87) PCT Pub. No.: WO2020/008874
PCT Pub. Date: Jan. 9, 2020

(65) Prior Publication Data
US 2021/0272882 A1 Sep. 2, 2021

(30) Foreign Application Priority Data
Jul. 5, 2018 (JP) .............................. JP2018-128571

(51) Int. Cl.
*H01L 23/495* (2006.01)
*H01L 23/492* (2006.01)
(Continued)

(52) U.S. Cl.
CPC ........ *H01L 23/492* (2013.01); *H01L 23/3107* (2013.01); *H01L 23/473* (2013.01);
(Continued)

(58) Field of Classification Search
CPC ............... H01L 23/492; H01L 23/3107; H01L 23/5385; H01L 24/48; H01L 25/072;
(Continued)

(56) References Cited

U.S. PATENT DOCUMENTS

| 2002/0003717 A1* | 1/2002 | Ruff ..................... H03K 17/127 365/63 |
| 2007/0052072 A1 | 3/2007 | Iwade |

(Continued)

FOREIGN PATENT DOCUMENTS

| JP | 2007-73743 A | 3/2007 |
| WO | WO-2015/132847 A1 | 9/2015 |

(Continued)

OTHER PUBLICATIONS

International Search Report with English translation and Written Opinion issued in corresponding application No. PCT/JP2019/024210 dated Oct. 1, 2019.

*Primary Examiner* — Caleb E Henry
*Assistant Examiner* — Dilinh P Nguyen
(74) *Attorney, Agent, or Firm* — Foley & Lardner LLP

(57) ABSTRACT

Detection accuracy of a collector sense in detecting a voltage is improved.

A power module 300 has a first conductor 410 and a second conductor 411 to which a plurality of active elements 317 and 315 configuring upper and lower arm circuits are connected. In addition, the power module 300 has an AC side terminal 320B protruding from one side 301*a*, a positive electrode side terminal 315B and a negative electrode side terminal 319B which protrude from the other side 301*b*, an intermediate electrode portion 414 that connects the first conductor 410 and the second conductor 411 to each other, and a collector sense wiring 452*a* in which a collector electrode of an active element 157 and the first conductor 410 are connected to each other via a sense connection (Continued)

portion 415. The intermediate electrode portion 414 is disposed close to the active element 157 which is closest to the AC side terminal 320B, and the sense connection portion 415 is disposed close to the active element 157 which is farthest from the AC side terminal 320B.

7 Claims, 17 Drawing Sheets

(51) Int. Cl.
*H01L 23/31* (2006.01)
*H01L 23/473* (2006.01)
*H01L 23/538* (2006.01)
*H01L 23/00* (2006.01)
*H01L 25/07* (2006.01)
*H02M 7/00* (2006.01)

(52) U.S. Cl.
CPC ........ *H01L 23/5385* (2013.01); *H01L 24/48* (2013.01); *H01L 25/072* (2013.01); *H01L 2224/48091* (2013.01); *H02M 7/003* (2013.01)

(58) Field of Classification Search
CPC ........ H01L 2224/48091; H01L 23/473; H01L 2224/0603; H01L 23/4334; H01L 23/49562; H01L 23/49575; H01L 2224/40137; H02M 7/003
USPC ........................................ 257/676
See application file for complete search history.

(56) References Cited

U.S. PATENT DOCUMENTS

2018/0254235 A1* 9/2018 Tsu .................. H01L 23/24
2019/0237448 A1* 8/2019 Nakashima .......... H01L 25/07

FOREIGN PATENT DOCUMENTS

WO    WO-2017/033295 A1    3/2017
WO    WO-2018/056213 A1    3/2018

\* cited by examiner (a)

(b)

(a)

(b)

(a)

(b)

(a)

(b)

POWER MODULE WITH ACTIVE ELEMENTS AND INTERMEDIATE ELECTRODE THAT CONNECTS CONDUCTORS

TECHNICAL FIELD

The present invention relates to a power module.

BACKGROUND ART

Power conversion devices adopting switching of power semiconductor elements have high conversion efficiency. Accordingly, the power conversion devices are widely used in consumer, vehicle, railway, and substation facilities. The power semiconductor elements generate heat when electric power is supplied thereto. Therefore, heat dissipation is highly required. As a power module configuring the power conversion device, there is a power module having a structure in which an insulated gate bipolar transistor (IGBT) and a diode are pinched by a pair of metal plates and sealed with a molding resin. Terminals connected to the IGBT and the diode are exposed from the molding resin. The IGBT and the diode configure either an upper arm circuit or a lower arm circuit. In a power module having a 2in1 structure having either the upper arm circuit or the lower arm circuit, a structure is known in which a collector lead and a collector sense are formed integrally with a metal plate. (for example, refer to PTL 1).

CITATION LIST

Patent Literature

PTL 1: JP 2007-73743 A

SUMMARY OF INVENTION

Technical Problem

PTL 1 has no disclosure relating to connection of the collector sense in the power module having the 2in1 structure in which the upper and lower arm circuits are integrated with each other.

Solution to Problem

According to an aspect of the present invention, there is provided a power module having a module main body having a polygonal shape in a plan view. The power module includes a plurality of first active elements configuring one of upper and lower arm circuits, a plurality of second active elements configuring the other of the upper and lower arm circuits, a first conductor to which a collector electrode of each of the plurality of first active elements is connected, a second conductor to which an emitter electrode of the plurality of second active elements is connected, a positive electrode side terminal and a negative electrode side terminal which protrude from one side of the module main body, an AC side terminal protruding from the other side different from the one side of the module main body, an intermediate electrode portion that connects the first conductor and the second conductor to each other, and a first collector sense wiring which has a first sense connection portion, and in which the collector electrode of the first active element and the first conductor are connected to each other via a first sense connection portion. The intermediate electrode portion is disposed close to the first active element which is closest to the AC side terminal, out of the plurality of first active elements, and the first sense connection portion is disposed close to the first active element which is farthest from the AC side terminal, out of the plurality of the first active elements.

Advantageous Effect of Invention

According to the present invention, detection accuracy of a collector sense in detecting a voltage can be improved.

BRIEF DESCRIPTION OF DRAWINGS

FIG. 16(a) is a perspective view when viewed from above, and FIG. 16(b) is a perspective view when viewed from below.

DESCRIPTION OF EMBODIMENTS

Figure 1:
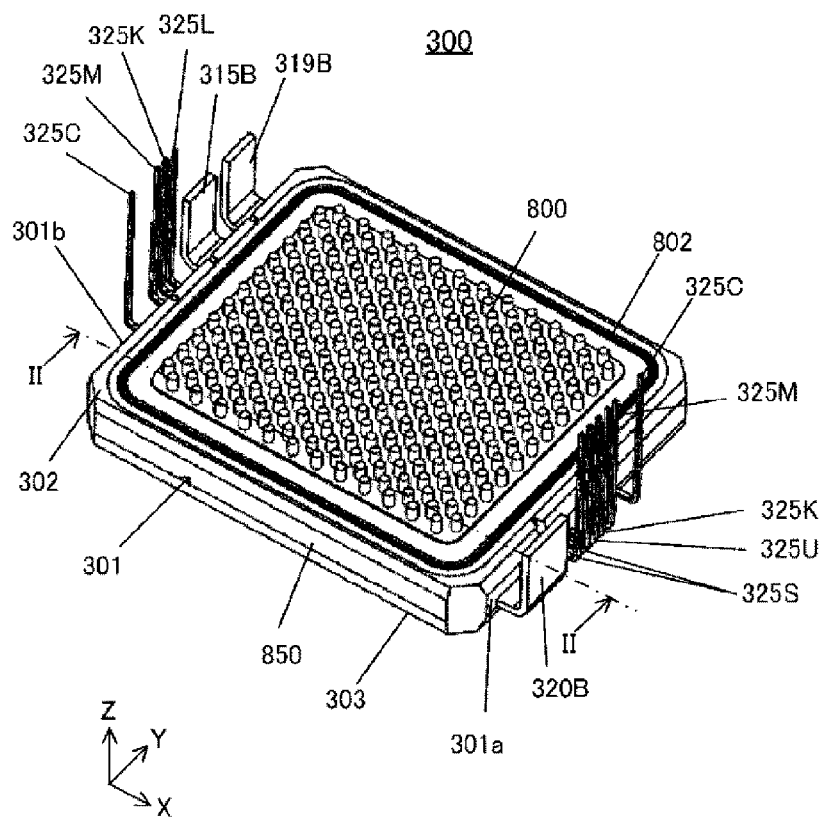
FIG. 1 is an external perspective view of an embodiment of a power module according to the present invention.

Hereinafter, an embodiment of the present invention will be described with reference to the drawings. The following description and drawings are examples for describing the present invention, and are appropriately omitted and simplified for clarifying the description. The present invention can be implemented in various other forms. Unless otherwise specified, respective configuration elements may be expressed by a singular form or a plurality of forms.

In some cases, a position, size, shape, or range of the respective configuration elements illustrated in the drawings may not represent an actual position, size, shape, or range to facilitate understanding of the invention. Therefore, the present invention is not necessarily limited to the position, size, shape, or range disclosed in the drawings.

Figure 2:
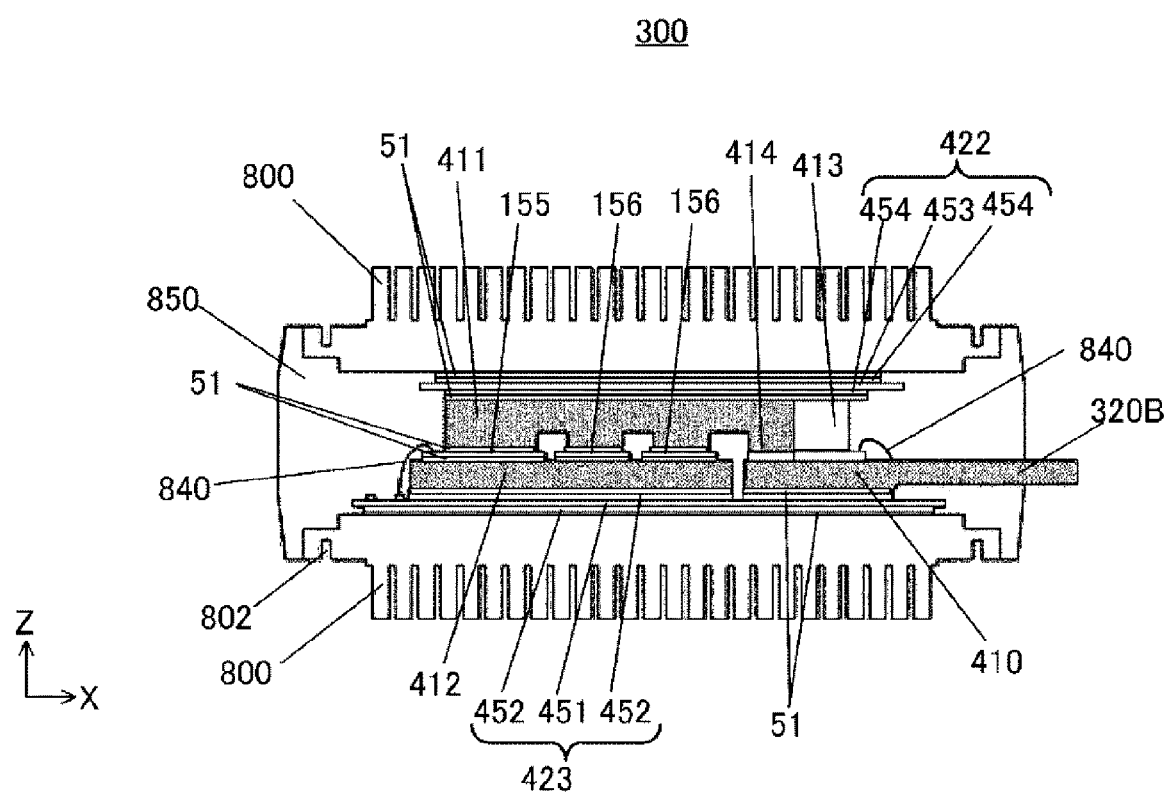
FIG. 2 is a cross-sectional view taken along line II-II of the power module illustrated in FIG. 1.
Figure 3:
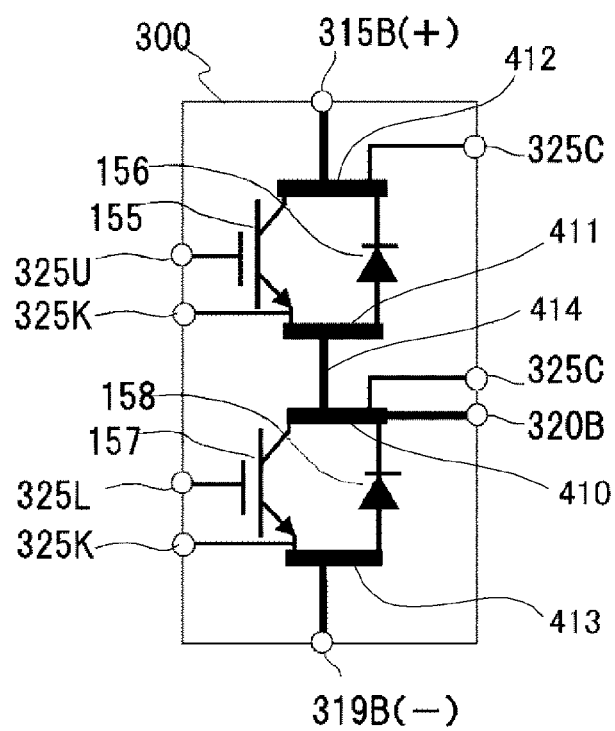
FIG. 3 is a circuit diagram illustrating an example of a circuit of the power module illustrated in FIG. 1.
Figure 4:
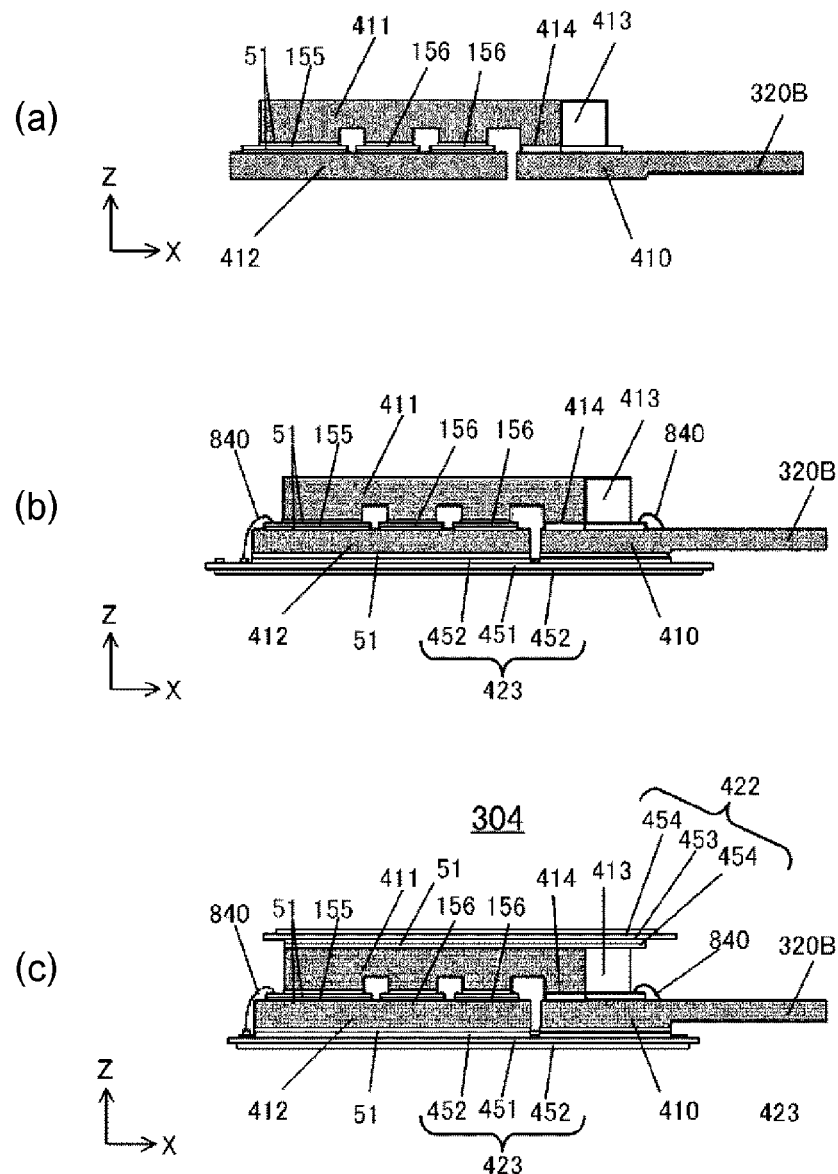
FIGS. 4(a) to 4(c) are cross-sectional views in each step for describing a method for manufacturing the power module illustrated in FIG. 1.

FIG. 1 is a plan view of an embodiment of a flow rate sensor according to the present invention when viewed from an upper surface side. FIG. 2 is a plan view of the flow rate sensor illustrated in FIG. 1 when viewed from a rear surface side. FIG. 3 is a cross-sectional view taken along line III-III of the flow rate sensor illustrated in FIG. 1. FIG. 4 is a cross-sectional view taken along line IV-IV of the flow rate sensor illustrated in FIG. 1.

In the following description, an X-direction, a Y-direction, and a Z-direction are as illustrated.

FIG. 1 is an external perspective view of an embodiment of a power module according to the present invention.

A power module 300 includes a power module main body 301 as a resin package in which internal electronic components are sealed with a resin 850, a fin base 800, a plurality of power terminals for inputting and outputting a large current, and a plurality of signal terminals for inputting and outputting a signal. The power module main body 301 has a substantially rectangular parallelepiped shape, in other words, a substantially rectangular shape in a plan view when a main surface 302 having the largest area is viewed in a vertical direction. The plurality of power terminals and the plurality of signal terminals protrude from one side 301a of the power module main body 301 in a length direction (X-direction) and the other side 301b facing the one side. The fin base 800 having a large number of fins is provided on each of the main surface 302 of the power module main body 301 and a rear surface 303 which is a facing surface of the main surface 302. An annular groove 802 is formed on an outer peripheral edge of each fin base 800.

Power terminals such as a positive electrode side terminal 315B and a negative electrode side terminal 319B protrude from the other side 301b of the power module main body 301. As the power terminal, an AC side terminal 320B protrudes from one side 301a of the power module main body 301.

Signal terminals such as a lower arm gate terminal 325L, a mirror emitter signal terminal 325M, a Kelvin emitter signal terminal 325K, and a collector sense signal terminal 325C protrude from the other side 301b of the power module main body 301. Signal terminals such as an upper arm gate terminal 325U, a temperature sense signal terminal 325S, a mirror emitter signal terminal 325M, a Kelvin emitter signal terminal 325K, and a collector sense signal terminal 325C protrude from one side 301a of the power module main body 301.

A signal transmitted from the Kelvin emitter signal terminal 325K indicates a reference of a gate signal. A signal transmitted from the collector sense signal terminal 325C is used for short-circuit protection.

As will be described later, the power module 300 has upper and lower arm circuits. When any one of the upper and lower arm circuits is short-circuited, short-circuit protection is performed by opening an arm circuit on a side which is not short-circuited to bring a current into a cut-off state. A mirror emitter can also be used together with a collector sense of each arm circuit in detecting the short-circuit protection. Redundancy can be provided by using a plurality of detection methods together. A signal transmitted from the temperature sense signal terminal 325S is used in monitoring a temperature of an active element (to be described later). When the temperature of the active element is higher than a predetermined temperature, the signal is used for protecting the active element by suppressing an increase in the temperature.

In the present specification, the plurality of power terminals and the plurality of signal terminals for inputting and outputting the signal include the power terminal including the positive electrode side terminal 315B, the negative electrode side terminal 319B, and the AC side terminal 320B. In addition, the plurality of power terminals and the plurality of signal terminals also include the signal terminals such as the mirror emitter signal terminal 325M, the Kelvin emitter signal terminal 325K, and the collector sense signal terminal 325C.

As illustrated in FIG. 1, the positive electrode side terminal 315B and the negative electrode side terminal 319B which are the power terminals, and the AC side terminal 320B are provided to face the other side 301b and one side 301a of the power module main body 301. Moreover, the positive electrode side terminal 315B, the negative electrode side terminal 319B, and the AC side terminal 320B are disposed on a diagonal line.

In addition, the collector sense signal terminal 325C protruding from one side 301a of the power module main body 301 and the AC side terminal 320B are disposed apart from each other in the vicinity of one end of the one side 301a and in the vicinity of the other end on a side opposite thereto. The collector sense signal terminal 325C protruding from the other side 301b of the power module main body 301, the positive electrode side terminal 315B, and the negative electrode side terminal 319B are disposed apart from each other in the vicinity of one end of the other side 301b and in the vicinity of the other end on a side opposite thereto. Therefore, the collector sense signal terminal 325C protruding from one side 301a of the power module main body 301 and the collector sense signal terminal 325C protruding from the other side 301b of the power module main body 301 are disposed on another diagonal line of the power module main body 301 having a rectangular shape.

The plurality of power terminals and the plurality of signal terminals are bent vertically from a length direction (X-direction) to a height direction (Z-direction), and extend in the same direction. The plurality of signal terminals are oriented in the same direction. Accordingly, a control circuit or a driver circuit is easily connected. In addition, a control terminal protrudes by being divided into two sides of one side 301a and the other side 301b of the power module main body 301. Accordingly, a creeping distance or a space distance between the terminals is secured.

The positive electrode side terminal 315B and the negative electrode side terminal 319B are disposed adjacent to each other on the other side 301b of the power module main body 301 in the Y-direction. In addition, the positive electrode side terminal 315B and the negative electrode side terminal 319B are arrayed to face a side surface which is a small area bent in an L-shape, thereby obtaining an advantageous effect of reducing the inductance while bringing input and output currents close to each other. In addition, the positive electrode side terminal 315B and the negative electrode side terminal 319B which are DC terminals are connected to a capacitor module 500 (refer to FIG. 13)

connected to a battery. Accordingly, both the terminals protrude from the same other side 301b, thereby obtaining an advantageous effect in that an inverter layout can be simplified. The AC side terminal 320B protrudes from a surface facing a surface from which a DC side terminal protrudes. The AC side terminal 320B is connected to a current sensor 180 (refer to FIG. 13), thereafter, is output from the inverter, and is connected to motor generators 192 and 194 (refer to FIG. 13). Therefore, the AC side terminal 320B protrudes in a direction different from that of the DC terminal connected to the capacitor module 500. In this manner, an advantageous effect is obtained in that the inverter layout can be simplified.

FIG. 2 is a cross-sectional view taken along line II-II of the power module illustrated in FIG. 1. FIG. 3 is a circuit diagram illustrating an example of a circuit of the power module illustrated in FIG. 1.

The power module 300 includes an upper arm circuit having a switching element including an active element 155 and a diode 156, and a lower arm circuit having a switching element including an active element 157 and a diode 158. As the active elements 155 and 157, transistors such as an insulated gate bipolar transistor (IGBT) and a metal-oxide-semiconductor field-effect transistor (MOSFET) are used. As the diodes 156 and 158, a Schottky diode (SBD) and a fast recovery diode (FRD) are used. As illustrated in FIG. 3, the positive electrode side terminal 315B is connected to a third conductor 412. A collector electrode of the active element 155 configuring the switching element of the upper arm circuit and a cathode electrode of the diode 156 are electrically connected to each other by the third conductor 412. An emitter electrode of the active element 155 and an anode electrode of the diode 156 are electrically connected to each other by a second conductor 411.

The negative electrode side terminal 319B is electrically connected to a fourth conductor 413. An emitter electrode of the active element 157 configuring the switching element of the lower arm circuit and an anode electrode of the diode 158 are electrically connected to each other by the fourth conductor 413. A collector electrode of the active element 157 and a cathode electrode of the diode 158 are electrically connected to each other by a first conductor 410. The first conductor 410 and the second conductor 411 are electrically connected to each other via an intermediate electrode portion 414. The AC side terminal 320B is electrically connected to the first conductor 410. The Kelvin emitter signal terminal 325K is connected to the emitter electrode and the collector electrode of each of the upper arm circuit and the lower arm circuit. The collector sense signal terminal 325C of the upper arm circuit is electrically connected to the third conductor 412, and the collector sense signal terminal 325C of the lower arm circuit is connected to the first conductor 410.

Figure 9:
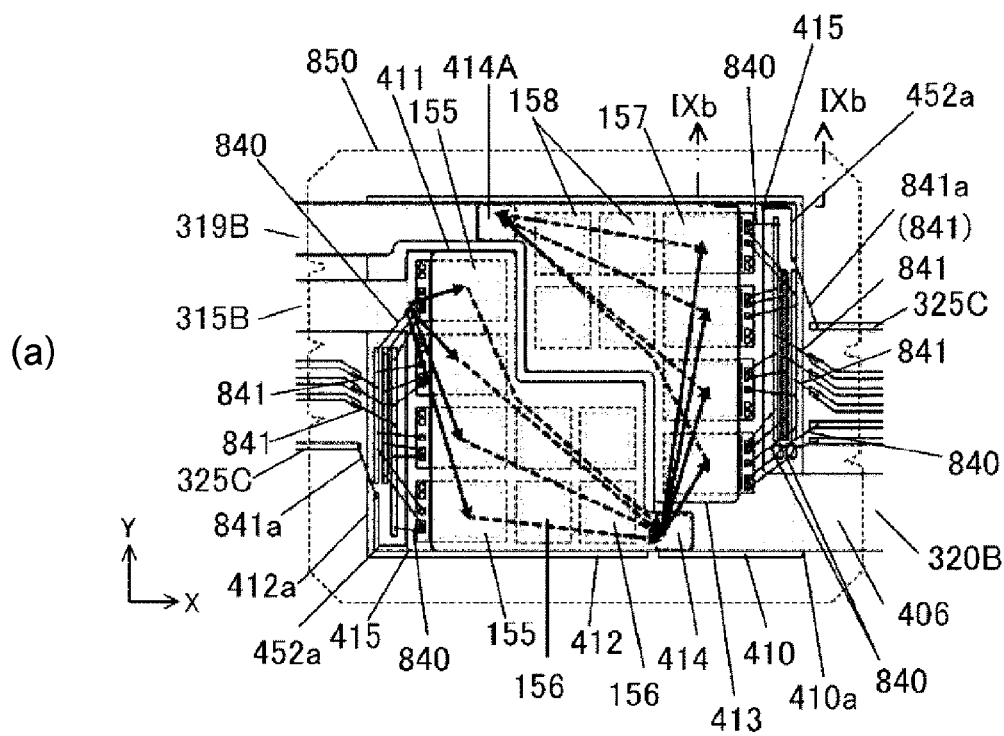
FIG. 9(a) is a plan view illustrating a current flow in the power module according to the present invention.
FIG. 9(b) is a cross-sectional view taken along line IXb-IXb in FIG. 9(a).
Figure 9:
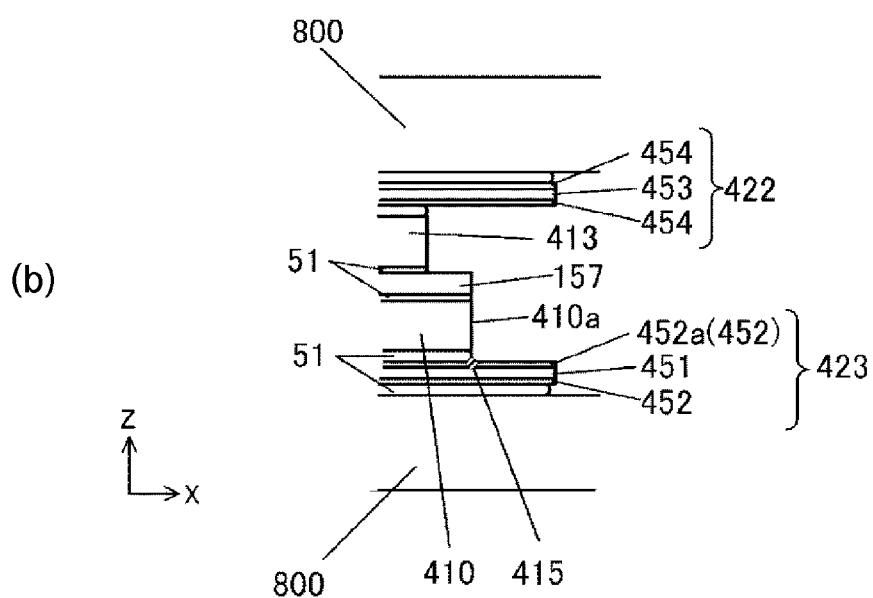

One active element 155 is configured to include a plurality of active elements 155, as is apparent from FIG. 9, for example. As illustrated in FIG. 2, the collector electrode of the plurality of active elements 155 and the anode electrode of the plurality of diodes 156 are joined to the third conductor 412 via a metal joining member 51 such as solder and sintered metal. The emitter electrode of the plurality of active elements 155 and the cathode electrode of the plurality of diodes 156 are joined to the second conductor 411 via the metal joining member 51 such as solder and sintered metal. The collector electrode of the plurality of active elements 157 and the anode electrode (not illustrated in FIG. 2) of the plurality of diodes 158 are joined to the first conductor 410 via the metal joining member 51 such as solder and sintered metal. The emitter electrode of the plurality of active elements 157 and the cathode electrode (not illustrated in FIG. 2) of the plurality of diodes 158 are joined to the fourth conductor 413 via the metal joining member 51 such as solder and sintered metal. The first conductor 410 is joined to the intermediate electrode portion 414 (refer to FIG. 6(a)) integrally formed with the second conductor 411 via the metal joining member 51. In this manner, the first conductor 410 and the second conductor 411 are electrically connected to each other. In the active elements 155 and 157, the entire lower surface is the collector electrode. In the diodes 156 and 158, the entire lower surface is the anode electrode. An active area of the upper surface is the cathode electrode.

The first to fourth conductors 410 to 413 are formed of copper or aluminum, but other materials may be used as long as the materials have high electrical conductivity. A collector side wiring board 423 is disposed below the first conductor 410 and the third conductor 412 (in a −Z-direction). The collector side wiring board 423 is joined to the first conductor 410 and the third conductor 412 via the metal joining member 51 such as solder and sintered metal. The collector side wiring board 423 is configured so that a wiring 452 made of copper or aluminum is formed on front and rear surfaces of an insulation plate 451 made of ceramic. The first conductor 410 and the third conductor 412 are joined to the wiring 452 via the metal joining member 51. The conductor or wiring subjected to metal joining may be plated or may be provided with fine irregularities in order to increase joining strength. Each electrode of the respective active elements 155 and 157 is connected to the wiring formed in the collector side wiring board 423 by a wire 840. The connection between each electrode of the respective active elements 155 and 157 and the wiring will be described later.

An emitter side wiring board 422 is disposed above the second conductor 411 and the fourth conductor 413 (in the Z-direction). The emitter side wiring board 422 is joined to the second conductor 411 and the fourth conductor 413 via the metal joining member 51 such as solder and sintered metal. The emitter side wiring board 422 is configured so that a wiring 454 made of copper or aluminum is formed on front and rear surfaces of an insulation plate 453 made of ceramic. The second conductor 411 and the fourth conductor 413 are joined to the wiring 454 formed in the emitter side wiring board 422 via the metal joining member 51.

The fin base 800 is joined to each of the lower surface of the collector side wiring board 423 and the upper surface of the emitter side wiring board 422. The collector side wiring board 423 or the emitter side wiring board 422, and the fin base 800 are joined to each other via the metal joining member 51 such as solder and sintered metal.

A space between the upper and lower fin bases 800 is sealed with a resin 850. The resin 850 is formed by means of transfer molding, for example.

FIGS. 4(a) to 4(c) are cross-sectional views in each step for describing a method of manufacturing the power module illustrated in FIG. 1. FIGS. 5(a) and 5(b) are cross-sectional views in each step for describing a method of manufacturing the power module, which is subsequent to FIGS. 4(a) to 4(c). In addition, FIGS. 6(a) to 6(c) are perspective views of steps respectively corresponding to FIGS. 4(a) to 4(c). FIGS. 7(a) and 7(b) are perspective views of steps respectively corresponding to FIGS. 5(a) and 5(b).

Referring to FIGS. 4(a) to 4(c), 5(a) and 5(b), 6(a) to 6(c), and 7(a) and 7(b), a method of manufacturing the power module 300 illustrated in FIG. 1 will be described.

As illustrated in FIGS. 4(a) and 6(a), the collector electrode of the plurality of active elements 155 and the cathode electrode of the plurality of diodes 156 are joined to the third conductor 412 via the metal joining member 51. Similarly, the collector electrode of the plurality of active elements 157 and the cathode electrode of the plurality of diodes 158 are joined to the first conductor 410 via the metal joining member 51.

In addition, the upper surface of the plurality of active elements 155 and the anode electrode of the plurality of diodes 156 are joined to the second conductor 411 via the metal joining member 51. Similarly, the upper surface of the plurality of active elements 155 and the anode electrode of the plurality of diodes 156 are joined to the fourth conductor 413 via the metal joining member 51.

As illustrated in FIG. 9, the plurality of (four are illustrated in the embodiment) active elements 155 and diodes 156 are disposed between the third conductor 412 and the second conductor 411. Similarly, the plurality of (four in the embodiment) active elements 157 and diodes 158 are disposed between the first conductor 410 and the fourth conductor 413. The upper arm circuit and the lower arm circuit are configured to include the plurality of active elements 155 and 157 and the diodes 156 and 158. In this manner, a large current can be supplied to a load such as a motor.

As illustrated in FIGS. 4(a) to 4(c) and FIGS. 5(a) and 5(b), the AC side terminal 320B having a smaller thickness than the first conductor 410 is formed integrally with the first conductor 410. In the AC side terminal 320B, an upper surface to which the active element 157 and the diode 158 are joined is flush with an upper surface of the first conductor 410, and a lower surface side has a step recessed from the lower surface of the first conductor 410 (in the drawing, located above in the Z-direction). In addition, the positive electrode side terminal 315B is formed integrally with the third conductor 412, and the negative electrode side terminal 319B is joined to an intermediate electrode 414A (refer to FIGS. 6 and 9) formed in the fourth conductor 413, for example, via a metal joining member.

Next, as illustrated in FIGS. 4(b) and 6(b), the collector side wiring board 423 is joined to the lower surface of the first conductor 410 and the third conductor 412 via the metal joining member 51. Each electrode of the respective active elements 155 and 157 is electrically connected to the wiring 452 of the collector side wiring board 423 by the wire 840. In addition, each wiring 452 and all signal terminals illustrated in FIG. 1 are connected to each other by a wire 841.

FIGS. 4(b) and 6(b) illustrate only one of the wires 840 and 841. However, as illustrated in FIG. 9(a), a plurality of the wires 840 and 841 are respectively provided. As illustrated in FIG. 6(b), the wiring 452 includes a collector sense wiring 452a, and the collector sense wiring 452a is connected to the collector sense signal terminal 325C by a wire 841a.

Next, as illustrated in FIGS. 4(c) and 6(c), the wiring 454 on the lower side (side in the −Z-direction) of the emitter side wiring board 422 is joined to the upper surface of the second conductor 411 and the fourth conductor 413 via the metal joining member 51.

A power module structure body illustrated in FIGS. 4(c) and 6(c) is set as a non-sealed module structure body 304.

The present embodiment adopts a structure in which the first conductor 410 and the third conductor 412 which are the collector side conductors are separated from the collector side wiring board 423. The thickness of the wiring 452 of the collector side wiring board 423 is thin. However, since the thickness of the first conductor 410 and the third conductor 412 is thick, heat can be diffused in a planar direction. The thickness of the wiring 452 of the collector side wiring board 423 is thinned. In this manner, the collector side wiring board 423 can be inexpensive. In addition, since the thickness of the wiring 452 is thin, a fine wiring pattern can be achieved. Therefore, an area of the collector side wiring board 423 can be reduced, and a size thereof can be reduced.

The same applies to the emitter side. The second conductor 411 and the fourth conductor 413 which are the emitter side conductors are separated from the emitter side wiring board 422. In this manner, heat can be diffused in a planar direction by the second conductor 411 and the fourth conductor 413. In addition, the emitter side wiring board 422 can be inexpensive, and a size thereof can be reduced.

Next, as illustrated in FIGS. 5(a) and 7(a), the fin bases 800 are respectively joined to the lower surface of the collector side wiring board 423 and the upper surface of the emitter side wiring board 422 via the metal joining member 51. The fin base 800 is made of aluminum, for example. When the wiring 452 of the collector side wiring board 423 and the wiring 454 of the emitter side wiring board 422 are made of copper, the fin base 800 is warped due to a thermal expansion difference between the aluminum and the copper. However, in the present embodiment, the fin bases 800 are respectively joined to the collector side wiring board 423 joined to the first conductor 410 and the third conductor 412, and the emitter side wiring board 422 joined to the second conductor 411 and the fourth conductor 413 via the metal joining member 51. Accordingly, it is possible to reduce the warpage when the fin base 800 is joined. Therefore, a joining step of the fin base 800 can be a low-pressure or no-pressure joining process instead of a pressure joining process. In this manner, costs for production facilities can be reduced.

A joining surface of the fin base 800 may be plated with nickel.

In addition, the collector side wiring board 423 or the emitter side wiring board 422 may be previously joined to the fin base 800 via the metal joining member 51.

Next, as illustrated in FIG. 5(b) and FIG. 7(b), the non-sealed module structure body 304 provided between the pair of upper and lower fin bases 800 is sealed with the resin 850. For example, sealing with the resin 850 is performed by means of resin molding such as transfer molding. Before the resin molding, the non-sealed module structure body 304 may be covered with a thin resin film.

Figure 8:
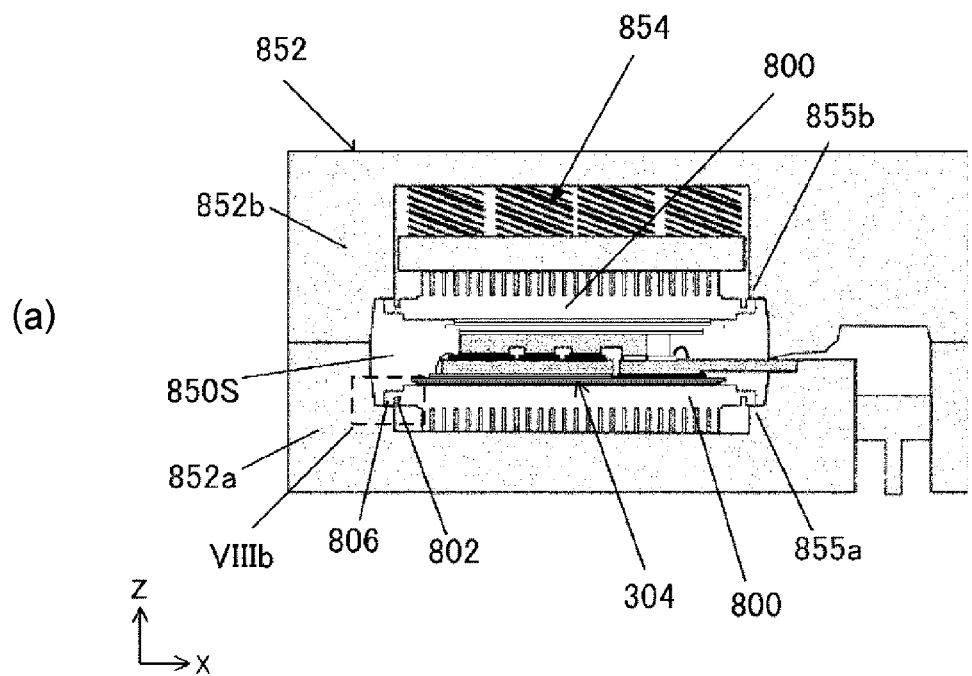
FIG. 8(a) is a cross-sectional view of a step of performing resin molding by installing a non-sealed module structure body in a mold.
FIG. 8(b) is an enlarged view of a region VIIIb in FIG. 8(a).
Figure 8:
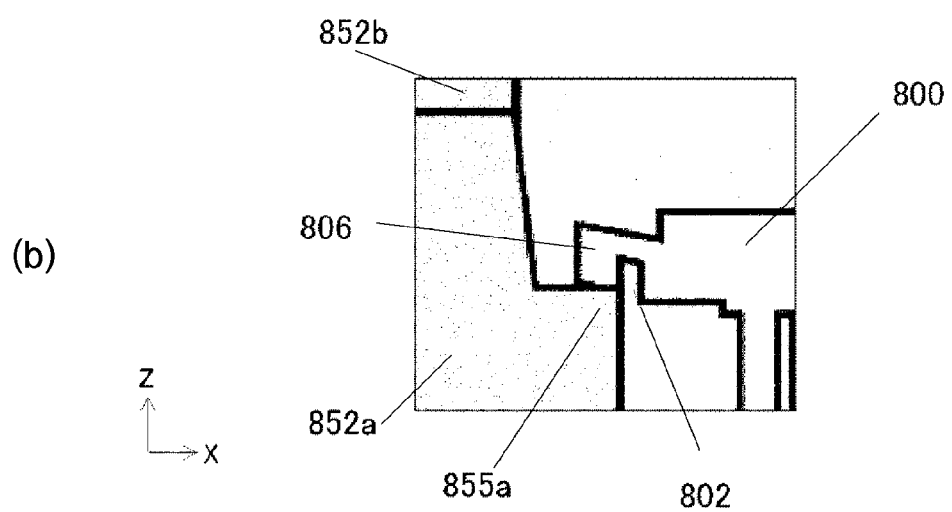

FIG. 8(a) is a cross-sectional view of a step of performing resin molding by installing the non-sealed module structure body in a mold.

As illustrated in FIG. 8(a), the non-sealed module structure body 304 is installed in a cavity of a mold 852 configured to include a lower mold 852a and an upper mold 852b in a state where the fin bases 800 are joined to the upper and lower surfaces of the non-sealed module structure body 304. A groove 802 is formed on an outer peripheral edge of each fin base 800, and an outer peripheral portion 806 which is a portion on the outer peripheral side of the groove 802 is brought into contact with a step portion 855a of the lower mold 852a or a step portion 855b of the upper mold 852b.

FIG. 8(b) is an enlarged view of a region VIIIb in FIG. 8(a). However, in FIG. 8(b), the collector side wiring board 423 is omitted in the illustration.

The length between the lower surfaces of the outer peripheral portions 806 of the upper and lower fin bases 800 is longer than the length between the step portion 855a of the lower mold 852a and the step portion 855b of the upper mold 852b. In addition, the length from the inner surface of the bottom portion of the lower mold 852a to the upper surface of the step portion 855a is longer than the length from the lower surface of the fin base 800 to the lower surface of the outer peripheral portion 806 of the fin base 800. Therefore, when the mold 852 is clamped, the outer peripheral portion 806 is pressed against the upper surface of the step portion 855a, and the fin base 800 is bent in the groove 802. In this manner, a resin material 850S injected to the periphery of the non-sealed module structure body 304 disposed between the pair of fin bases 800 does not leak to the fin base 800 side from a contact portion between the outer peripheral portion 806 and the step portion 855a of the fin base 800.

When the non-sealed module structure body 304 to which the pair of fin bases 800 is joined is strongly clamped by the mold 852, excessive stress is generated in the active elements 155 and 157. However, the groove 802 is provided in the fin base 800, and the fin base 800 is configured to be bent in the groove 802 with a small load. Therefore, the stress acting on the active elements 155 and 157 can be relieved.

In addition, a spring mechanism 854 is provided inside the mold 852. The spring mechanism 854 has a function of preventing peeling which acts on the active elements 155 and 157 via the first to fourth conductors 410 to 413 or the collector side and emitter side wiring boards 422 and 423. That is, due to the resin material 850S filling the periphery of the non-sealed module structure body 304 installed in the cavity of the mold 852, a pressure acts on the upper and lower fin bases 800 to widen a space between the fin bases 800. Therefore, a peeling force acts on the active elements 155 and 157 via the first to fourth conductors 410 to 413 or the collector side and emitter side wiring boards 423 and 422. A pressing force applied to the non-sealed module structure body 304 by the spring mechanism 854 is set to be stronger than a pressing force applied to the non-sealed module structure body 304 by a mold clamping force of the upper and lower molds 852a and 852b. In this manner, the peeling force acting on the active elements 155 and 157 can be canceled.

The active elements 155 and 157 are strong against the pressing force, but are weak against the peeling force, thereby causing a breakage or a failure. The pressing force applied to the non-sealed module structure body 304 by the spring mechanism 854 is set to be stronger than the peeling force generated by the pressure of the resin material 850S. In this manner, it is possible to prevent the breakage or the failure of the active elements 155 and 157 during the resin molding.

Although not illustrated, the first to fourth conductors 410 to 413, the power terminal, and the signal terminal are packaged until a resin molding step in a state where the first to fourth conductors 410 to 413, the power terminal, and the signal terminal are connected by a tie bar. After the resin molding, the tie bar is cut, and the power terminal and the signal terminal are processed into a predetermined shape. In this manner, the power module 300 illustrated in FIG. 1 can be obtained.

FIG. 9(a) is a plan view illustrating a current flow in the power module according to the present invention.

As illustrated in FIG. 3, the power module 300 according to the present embodiment has a 2in1 structure in which the upper arm circuit and the lower arm circuit are integrated with each other.

In FIG. 9(a), the fin base 800, the resin 850, and the emitter side wiring board 422 are not illustrated. The second conductor 411 and the fourth conductor 413 which are the emitter side conductors are illustrated in a semi-transparent manner, and an outer shape of the resin 850 is illustrated by a broken line. In addition, the current flow by way of the active elements 155 and 157 is illustrated by an arrow. In currents, a current flowing on the collector side is illustrated by a solid line, and a current flowing on the emitter side is illustrated by a broken line.

The current intensively enters the positive electrode side terminal 315B which is the power terminal connected to the positive electrode of the capacitor module 500 (refer to FIG. 13) from the capacitor side.

The current entering from the positive electrode side terminal 315B is divided and enters each collector electrode of the plurality of active elements 155 by way of the third conductor 412 which is the collector side conductor of the upper arm circuit. The current entering the collector electrode of each active element 155 is output from the emitter electrode of each active element 155, flows to the intermediate electrode portion 414 by way of the second conductor 411 which is the emitter side conductor of the upper arm circuit, and concentrates on the intermediate electrode portion 414.

The current concentrating on the intermediate electrode portion 414 flows to the first conductor 410 which is the collector side conductor of the lower arm circuit. The current is divided into two current paths from the first conductor 410. One is a current path through which the current flows to the AC side electrode 406 which is the power terminal, and the other is a current path which is divided into the plurality of active elements 157. The AC side electrode 406 is a region inside the resin 850 connected to the AC side terminal 320B. The AC current is supplied to the motor generators 192 and 194 (refer to FIG. 13) by way of the AC side electrode 406 and the AC side terminal 320B.

The current concentrating on the intermediate electrode portion 414 is divided and enters each collector electrode of the plurality of active elements 157 configuring the lower arm circuit from the intermediate electrode portion 414 by way of the first conductor 410. The current entering the collector electrode of each active element 157 is output from the emitter electrode of each active element 157, and concentrates again on the negative electrode side terminal 319B which is the power terminal by way of the fourth conductor 413 and the intermediate electrode 414A which are the emitter side conductors of the lower arm circuit.

That is, the current flowing from the capacitor module 500 side to the power module 300 intensively flows to the intermediate electrode portion 414, and the positive electrode side terminal 315B, the negative electrode side terminal 319B, and the AC side terminal 320B which are the power terminals. Therefore, out of the plurality of active elements 155 of the upper arm circuit and the plurality of active elements 157 of the lower arm circuit, there is a tendency that the current concentrates on the active elements 155 and 157 close to the positive electrode side terminal 315B, the negative electrode side terminal 319B, the AC side terminal 320B, and the intermediate electrode portion 414. On the other hand, there is a tendency that the current is less likely to concentrate on the active elements 155 and 157 apart from the terminals.

FIG. 9(b) is a cross-sectional view taken along line IXb-IXb in FIG. 9(a).

The fourth conductor 413 is joined to the upper surface side of the active element 157 via the metal joining member 51, and the emitter side wiring board 422 is joined to the upper surface of the fourth conductor 413 via the metal joining member 51. The fin base 800 is joined to the upper surface of the emitter side wiring board 422 via the metal joining member 51. The emitter side wiring board 422 has a structure in which the wiring 454 is formed on each of the upper and lower surfaces of the insulation plate 453. The fourth conductor 413 is joined to the wiring 454 on the lower surface side of the emitter side wiring board 422, and the fin base 800 is joined to the wiring 454 on the upper surface side of the emitter side wiring board 422.

The first conductor 410 is joined to the lower surface side of the active element 157 via the metal joining member 51, and the collector side wiring board 423 is joined to the lower surface of the first conductor 410 via the metal joining member 51. The fin base 800 is joined to the lower surface of the collector side wiring board 423 via the metal joining member 51. The collector side wiring board 423 has a structure in which the wiring 452 is formed on each of the upper and lower surfaces of the insulation plate 451. The first conductor 410 is joined to the wiring 452 on the upper surface side of the collector side wiring board 423, and the fin base 800 is joined to the wiring 452 on the lower surface side of the collector side wiring board 423.

Figure 6:
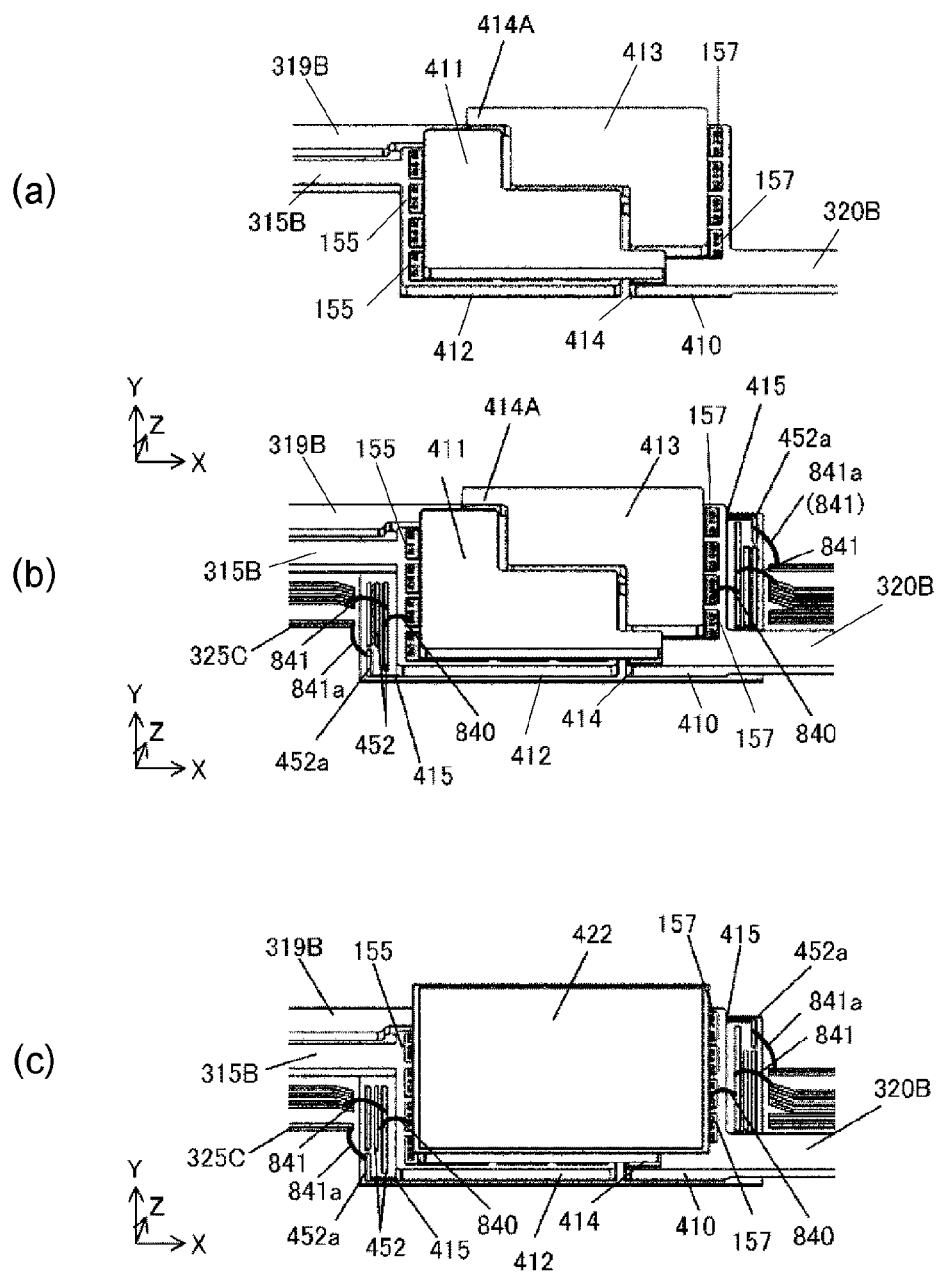
FIGS. 6(a) to 6(c) are perspective views of steps respectively corresponding to FIGS. 4(a) to 4(c).
Figure 7:
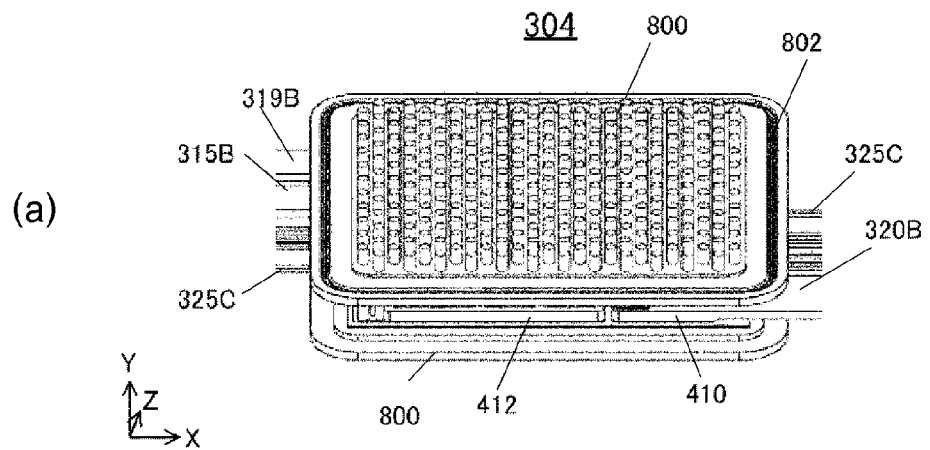
FIGS. 7(a) and 7(b) are perspective views of steps respectively corresponding to FIGS. 5(a) and 5(b).
Figure 7:
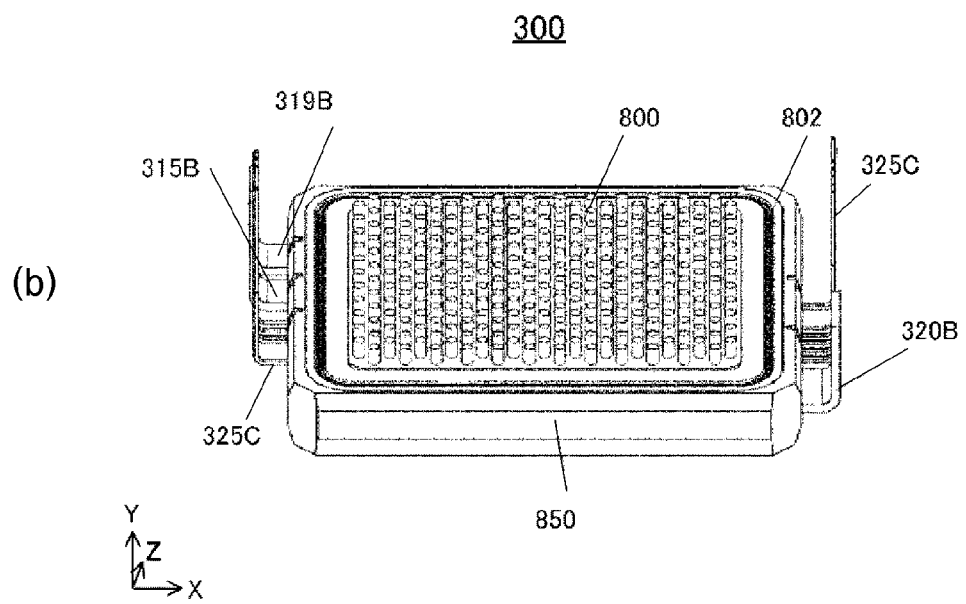

The wiring 452 on the upper surface side of the collector side wiring board 423 includes the collector sense wiring 452a (refer to FIG. 6(*b*)). The collector sense wiring 452a is joined to the lower surface of the first conductor 410 via the metal joining member 51, and is electrically connected to the first conductor 410. In the collector sense wiring 452a, a portion intersecting a side edge 410a of the first conductor 410 is a sense connection portion 415. Although the above-described configuration represents a structure of a collector sense region on the lower arm side, a structure of a collector sense region on the upper arm side is the same.

The sense connection portion 415 on the lower arm side is disposed in an end portion on a side opposite in the Y-direction to an end portion where the AC side terminal 320B is disposed in the side edge 410a of the first conductor 410. In addition, the sense connection portion 415 on the upper arm side is disposed in an end portion on a side opposite in the Y-direction to an end portion where the positive electrode side terminal 315B is disposed in a side edge 412a (refer to FIG. 9(*a*)) of the third conductor 412. The AC side terminal 320B and the positive electrode side terminal 315B are disposed on a diagonal line of the power module 300.

In general, when there is a change in the current, a voltage is affected by self-inductance L, a current I, and a time t, thereby generating an induced electromotive force V of $-L(dI/dt)$. The induced electromotive force is added to a voltage to be detected by the collector sense. Accordingly, accuracy in detecting the voltage is degraded. A place where the current intensively flows has a large current change due to switching. Accordingly, the induced electromotive force V increases. That is, the sense connection portion 415 that detects the voltage by the collector sense is separated from a current concentrating portion. In this manner, there is an advantageous effect in that the accuracy in detecting the voltage is improved. The power module 300 having the 2in1 structure in which the upper arm circuit and the lower arm circuit are incorporated has the intermediate electrode portion 414. The intermediate electrode portion 414 is not found in a 1in1 structure in which the upper arm circuit and the lower arm circuit are not integrated with each other.

The intermediate electrode portion 414 is the current concentrating portion. Accordingly, the sense connection portion 415 of the collector sense is provided in a place apart from any of the intermediate electrode portion 414, the positive electrode side terminal 315B, the negative electrode side terminal 319B, and the AC side terminal 320B. In this manner, the voltage can be more accurately detected.

Figure 5:
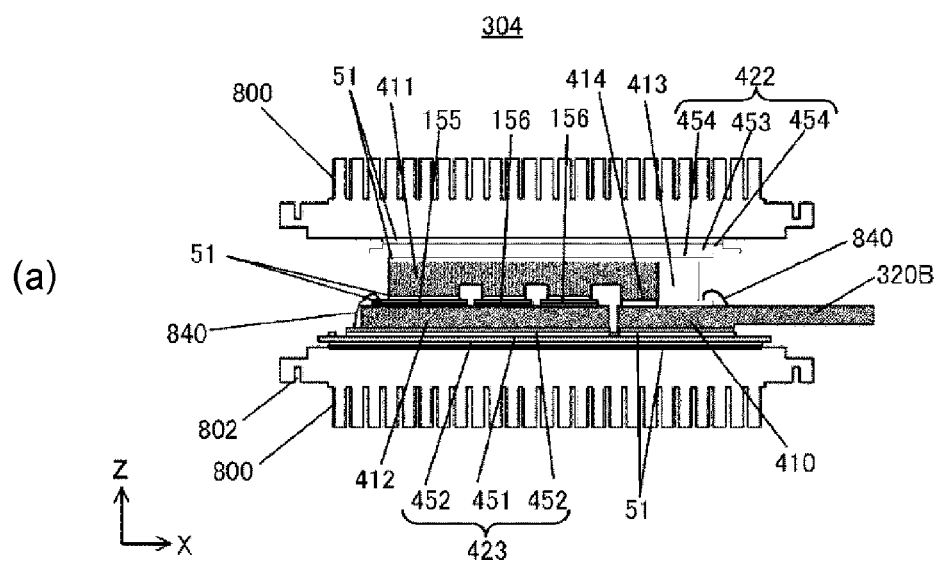
FIGS. 5(a) and 5(b) are cross-sectional views in each step for describing a method of manufacturing the power module, which is subsequent to FIGS. 4(a) to 4(c).
Figure 5:
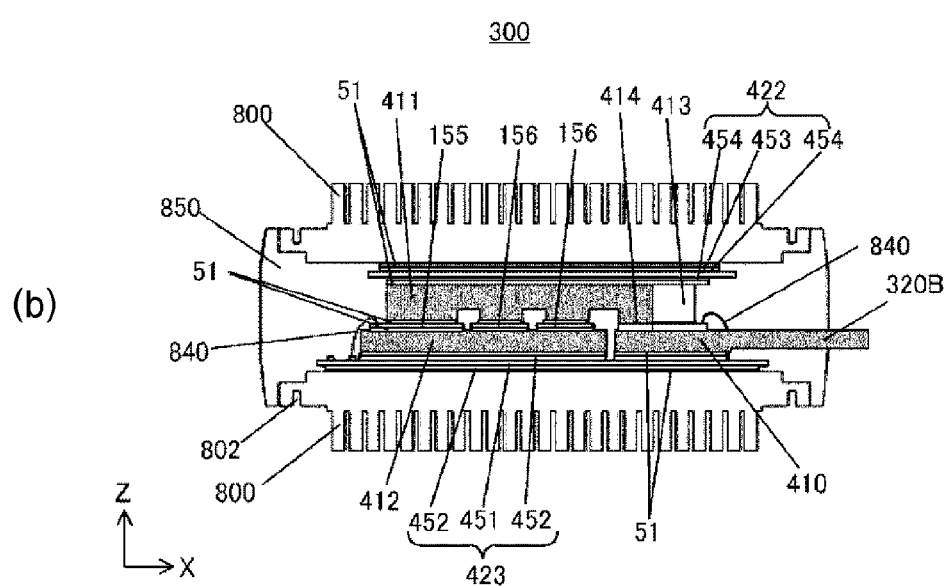

As illustrated in FIG. 9(*b*), the sense connection portion 415 is disposed on the lower surface on a side opposite (−Z-direction) in the thickness direction to the upper surface of the first conductor 410 to which the active element 157 is joined. In addition, as illustrated in FIGS. 4 and 5, the AC side terminal 320B is thinner than the first conductor 410. The lower surface of the AC side terminal 320B is disposed on the upper surface side to which the active element 157 is joined, compared to the lower surface of the first conductor 410. That is, in the thickness direction, the first conductor 410 has an element side region portion provided on the active elements 155 and 157 side, and a wiring side region portion provided on a side opposite in the thickness direction to the active elements 155 and 157 side. The sense connection portion 415 is connected to the wiring side region portion via the metal joining member 51, and the AC side terminal 320B is connected to the element side region portion. The sense connection portion 415 is disposed at a position apart in the thickness direction of the first conductor 410 from the upper surface to which the active elements 155 and 157 of the first conductor 410 where the current concentrates are joined. Therefore, the collector sense can more accurately detect the voltage.

Figure 10:
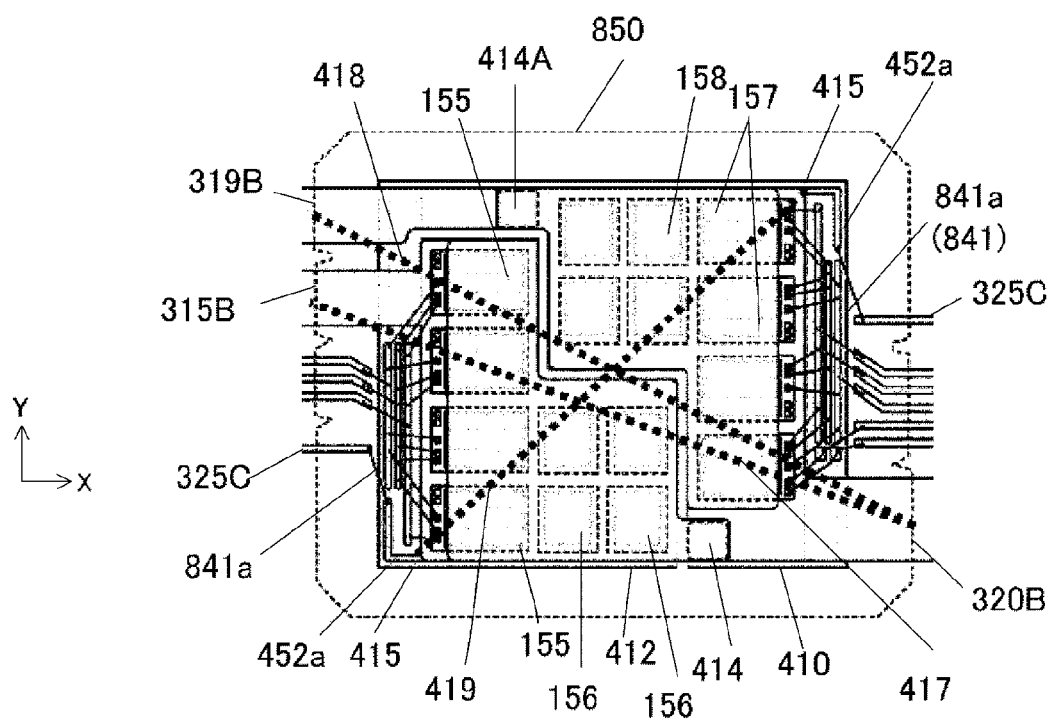
FIG. 10 is a plan view illustrating a disposition relationship between a power terminal and a sense connection portion in the power module according to the present invention.

FIG. 10 is a plan view illustrating a disposition relationship between the power terminal and the sense connection portion in the power module according to the present invention.

In FIG. 10, the fin base 800, the resin 850, and the emitter side wiring board 422 are not illustrated. The second conductor 411 and the fourth conductor 413 which are the emitter side conductors are illustrated in a semi-transparent manner, and the outer shape of the resin 850 is illustrated by a broken line. In addition, a first line segment 417 connecting the positive electrode side terminal 315B and the AC side terminal 320B to each other, a second line segment 418 connecting the negative electrode side terminal 319B and the AC side terminal 320B to each other, and a third line segment 419 connecting the sense connection portion 415 of the lower arm circuit and the sense connection portion 415 of the upper arm circuit to each other are illustrated.

As illustrated in FIG. 10, the first line segment 417 connecting the positive electrode side terminal 315B and the AC side terminal 320B to each other intersects the third line segment 419 connecting the sense connection portion 415 of the lower arm circuit and the sense connection portion 415 of the upper arm circuit to each other. In addition, the second line segment 418 connecting the negative electrode side terminal 319B and the AC side terminal 320B to each other intersects the third line segment 419 connecting the sense connection portion 415 of the lower arm circuit and the sense connection portion 415 of the upper arm circuit to each other.

The power terminals such as the positive electrode side terminal 315B, the negative electrode side terminal 319B, and the AC side terminal 320B are thicker and wider than the signal terminals. Accordingly, the weight of the power terminals is heavy. The first line segment 417 and the third line segment 419 intersect each other, and the second line segment 418 and the third line segment 419 intersect each other. In this manner, the heavy terminals are located on the diagonal line.

According to this structure, when the fin base 800 is connected by means of soldering, weight imbalance caused by the power terminals gathering on one side of the non-sealed module structure body 304 is prevented. In this manner, there is an advantageous effect in that the fin base 800 can be joined to have a uniform thickness. In addition, the fin bases 800 is joined to have the uniform thickness. Accordingly, bending angles in the groove 802 of the fin base 800 can be substantially uniform in a state of being installed in the cavity of the mold 852 during the transfer molding. Therefore, there is an advantageous effect in that the leakage of the resin material 850S to the fin base 800 side can be reliably prevented. Furthermore, a structure in which the third line segment 419 intersects the first line segment 417 and the second line segment 418 is adopted. In this manner, there is an advantageous effect in that the sense connection portion 415 is located at a position apart from not only the power terminals such as the positive electrode side terminal 315B, the negative electrode side terminal 319B, and the AC side terminal 320B, but also the intermediate electrode portion 414 which is the current concentrating portion.

Figure 11:
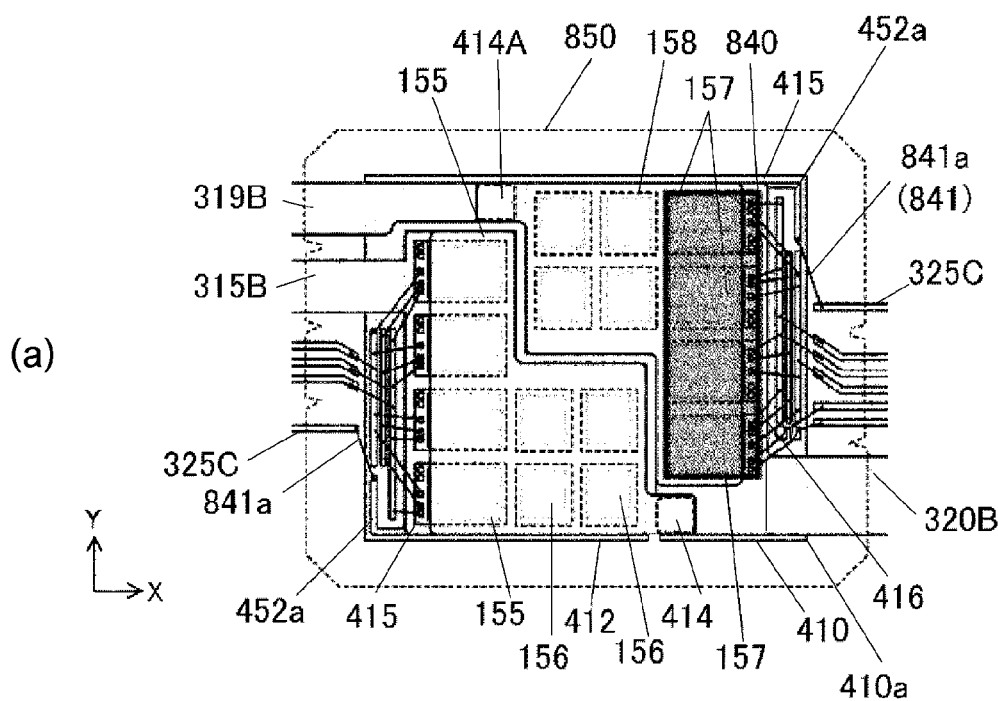
FIG. 11(a) is a plan view illustrating a positional relationship between an active element disposition region, and the sense connection portion and an AC side electrode in the power module according to the present invention.
FIG. 11(b) is a cross-sectional view of the power module according to the present invention.
Figure 11:
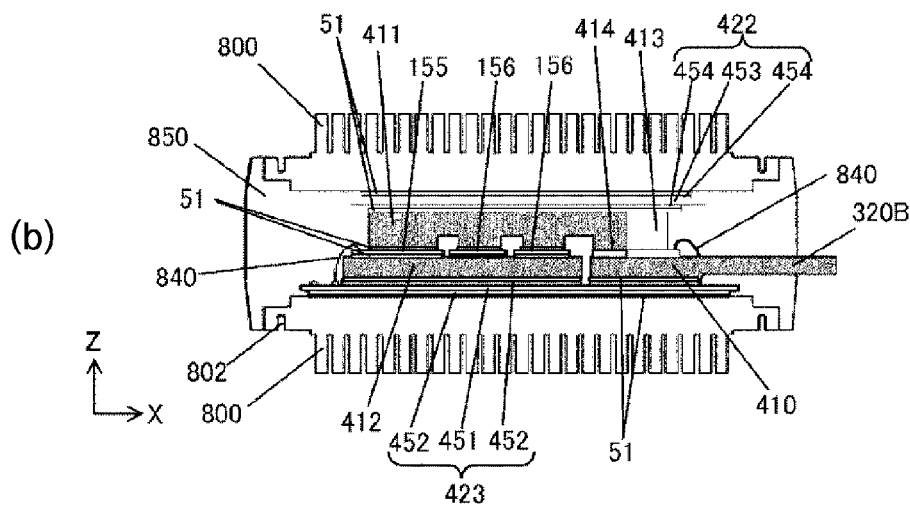

FIG. 11(*a*) is a plan view illustrating a positional relationship between an active element disposition region, and the sense connection portion and the AC side electrode in the power module according to the present invention. FIG. 11(*b*) is a cross-sectional view of the power module according to the present invention. FIG. 11(*b*) is the same as FIG. 2, but is illustrated again to facilitate understanding of a comparison with FIG. 11(*a*).

In FIG. 11(*a*), the fin base 800, the resin 850, and the emitter side wiring board 422 are not illustrated. The second conductor 411 and the fourth conductor 413 which are the emitter side conductors are illustrated in a semi-transparent manner, and the outer shape of the resin 850 is illustrated by a broken line.

The plurality of (four are illustrated in the embodiment) active elements 157 joined to the upper surface of the first conductor 410 configuring the lower arm circuit are arrayed at a predetermined interval along one side edge 410*a* of the first conductor 410. A region from the active element 157 closest to the sense connection portion 415 disposed on one end side in the Y-direction of the side edge 410*a* of the first conductor 410 to the active element 157 closest to the AC side terminal 320B disposed on the other end side in the Y-direction of the side edge 410*a* of the first conductor 410 is an element array region 416. In FIG. 11(*a*), the element array region 416 is hatched.

The sense connection portion 415 of the lower arm circuit is disposed outside the active element 157 which is farthest in the element array region 416 when viewed from the AC side terminal 320B.

In this way, the sense connection portion 415 of the lower arm circuit is disposed outside the active element 157 which is farthest in the element array region 416 when viewed from the AC side terminal 320B. In other words, the sense connection portion 415 of the collector sense is provided at a position apart from the AC side terminal 320B where the current concentrates. Accordingly, the collector sense can more accurately detect the voltage.

Figure 12:
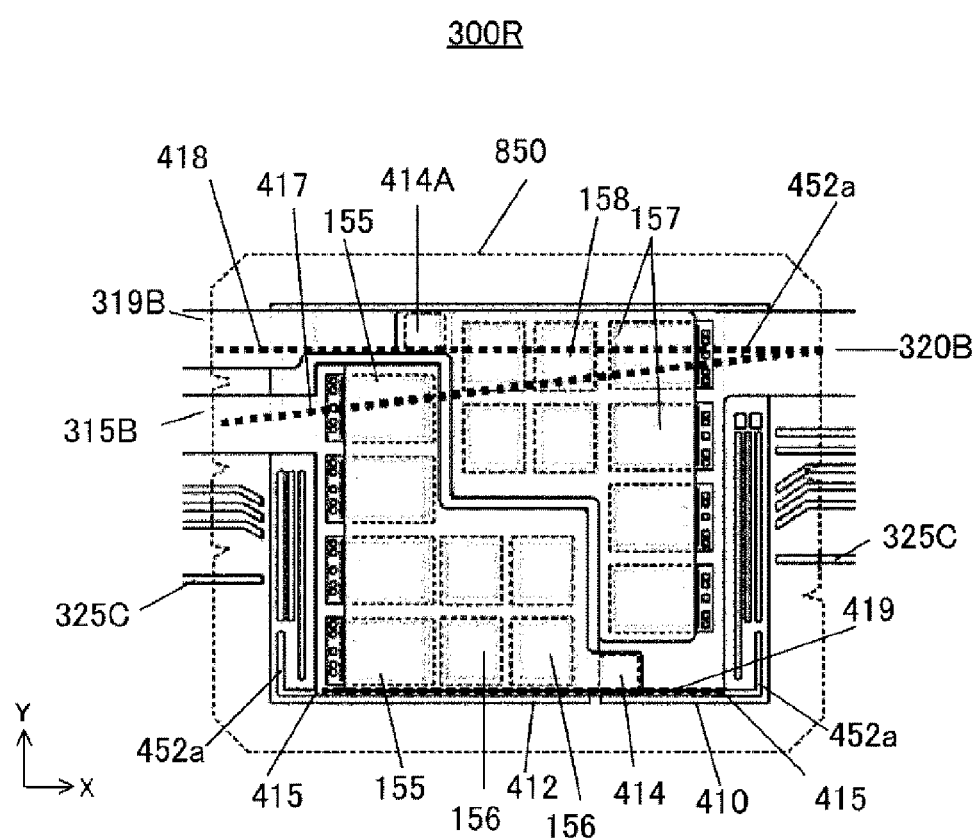
FIG. 12 is a plan view of a power module of a comparative example illustrated as a comparison with the power module according to the present invention illustrated in FIG. 10.

FIG. 12 is a plan view of a power module according to a comparative example illustrated as a comparison with the power module according to the present invention illustrated in FIG. 10.

In FIG. 12, the fin base 800, the resin 850, and the emitter side wiring board 422 are not illustrated. The second conductor 411 and the fourth conductor 413 which are the emitter side conductors are illustrated in a semi-transparent manner, and the outer shape of the resin 850 is illustrated by a broken line. In addition, the first line segment 417 connecting the positive electrode side terminal 315B and the AC side terminal 320B to each other, the second line segment 418 connecting the negative electrode side terminal 319B and the AC side terminal 320B to each other, and the third line segment 419 connecting the sense connection portion 415 of the lower arm circuit and the sense connection portion 415 of the collector sense of the upper arm circuit to each other are illustrated.

As illustrated in FIG. 12, a power module 300R having a structure in which the third line segment 419 does not intersect the first line segment 417 and the second line segment 418 is produced as the comparative example. That is, in the power module 300R according to the comparative example, the AC side terminal 320B is not disposed on the diagonal line of the side facing the positive electrode side terminal 315B or the negative electrode side terminal 319B, and is disposed on the substantially same end portion side of the facing side. In addition, the sense connection portions 415 of the upper arm and the lower arm are disposed in an end portion on a side opposite to the power terminal side of the facing side.

As described above, the power terminals such as the positive electrode side terminal 315B, the negative electrode side terminal 319B, and the AC side terminal 320B are thicker and wider than the signal terminals. Accordingly, the weight of the power terminals is heavy. The heavy power terminals are disposed on the substantially same end portion side of the facing side. Therefore, when the fin base 800 is connected by means of soldering, the power terminals gather on one side, thereby resulting in weight imbalance, and the fin base 800 has an uneven joining thickness. In addition, a structure in which the third line segment 419 does not intersect either the first line segment 417 or the second line segment 418 is adopted. Accordingly, as illustrated in FIG. 12, a structure is adopted so that the sense connection portion 415 of the collector sense of the lower arm circuit is close to the intermediate electrode portion 414 which is the current concentrating portion. Therefore, a large induced electromotive force overlaps the voltage detected by the collector sense, and the accuracy of the collector sense in detecting the voltage is degraded.

Figure 13:
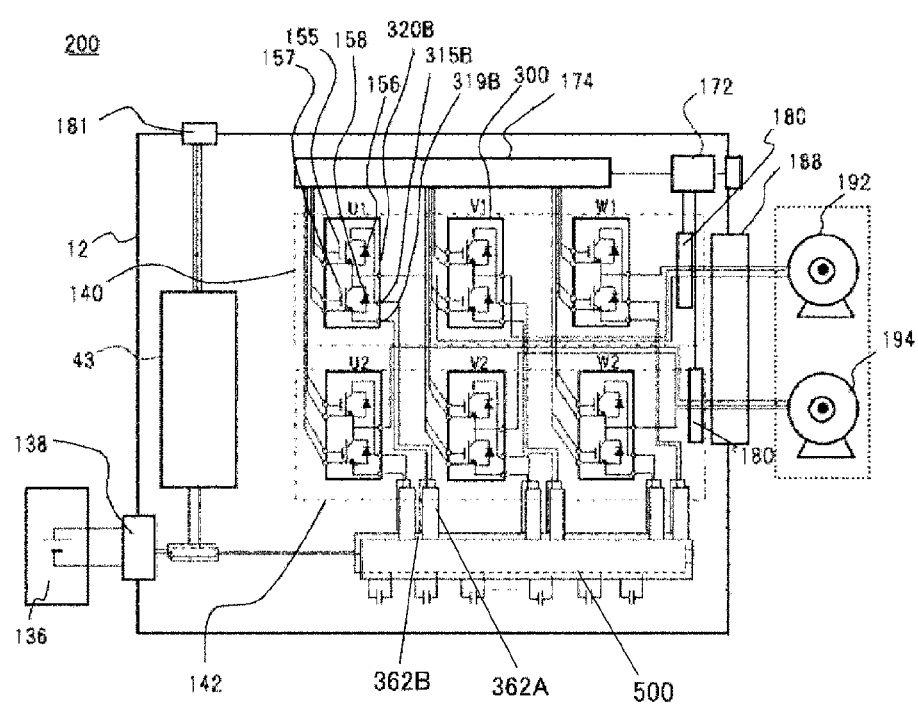
FIG. 13 is a circuit diagram of a power conversion device using the power module according to the present invention.

FIG. 13 is a circuit diagram of a power conversion device using a power module according to the present invention.

A power conversion device 200 includes inverter circuit units 140 and 142, an auxiliary machine inverter circuit unit 43, and a capacitor module 500. The inverter circuit units 140 and 142 include a plurality of the power modules 300, which are connected to each other to configure a three-phase bridge circuit. When current capacity is large, the power modules 300 are further connected in parallel, and the parallel connection is performed corresponding to each phase of the three-phase inverter circuit. In this manner, it is possible to cope with an increase in the current capacity. In addition, the active elements 155 and 157 and the diodes 156 and 158 which are the power semiconductor elements incorporated in the power module 300 are connected in parallel. In this manner, it is also possible to cope with the increase in the current capacity.

The inverter circuit unit 140 and the inverter circuit unit 142 have the same basic circuit configuration, and basically have the same control method or the same operation. A schematic circuit operation of the inverter circuit unit 140 is well known, and thus, detailed description thereof will be omitted herein.

As described above, the upper arm circuit includes the upper arm active element 155 and the upper arm diode 156 as switching power semiconductor elements. The lower arm circuit includes the lower arm active element 157 and the lower arm diode 158 as switching power semiconductor elements. The active elements 155 and 157 perform a switching operation by receiving a drive signal output from one or the other of two driver circuits configuring a driver circuit 174, and convert DC power supplied from a battery 136 into three-phase AC power.

As described above, the upper arm active element 155 and the lower arm active element 157 include a collector electrode, an emitter electrode, and a gate electrode. The upper arm diode 156 and the lower arm diode 158 include two electrodes such as a cathode electrode and an anode electrode. As illustrated in FIG. 3, the cathode electrode of the diodes 156 and 158 is electrically connected to the collector electrode of the IGBTs 155 and 157, and the anode electrode is electrically connected to the emitter electrode of the active elements 155 and 157, respectively. In this manner, the current flows in a forward direction from the emitter electrode to the collector electrode of the upper arm active element 155 and the lower arm active element 157.

A metal-oxide-semiconductor field-effect transistor (MOSFET) may be used as the active element. In this case, the upper arm diode 156 and the lower arm diode 158 are unnecessary.

The positive electrode side terminal 315B and the negative electrode side terminal 319B of respective upper and lower arm series circuits are respectively connected to capacitor connecting DC terminals of the capacitor module 500. The AC power is generated in each connection portion between the upper arm circuit and the lower arm circuit, and the connection portion between the upper arm circuit and the lower arm circuit of the respective upper and lower arm series circuits is connected to the AC side terminal 320B of the respective power modules 300. The AC side terminals 320B of the respective power modules 300 having each phase are respectively connected to AC output terminals of the power conversion device 200, and the generated AC power is supplied to a stator winding of the motor generator 192 or 194.

A control circuit 172 generates a timing signal for controlling a switching timing of the upper arm active element 155 and the lower arm active element 157, based on input information from a vehicle side control device or sensor (for example, the current sensor 180). The driver circuit 174 generates a drive signal for performing a switching operation on the upper arm active element 155 and the lower arm active element 157, based on the timing signal output from the control circuit 172.

The reference numerals 181, 182, and 188 represent connectors.

The upper and lower arm series circuits include a temperature sensor (not illustrated), and temperature information of the upper and lower arm series circuits is input to a microcomputer. In addition, voltage information on the DC positive electrode side of the upper and lower arm series circuits is input to the microcomputer. The microcomputer performs excessive temperature detection and excessive voltage detection, based on the information. When an excessive temperature or an excessive voltage is detected, the microcomputer stops a switching operation of all upper arm active elements 155 and all lower arm active elements 157 to protect the upper and lower arm series circuits from the excessive temperature or the excessive voltage.

Figure 14:
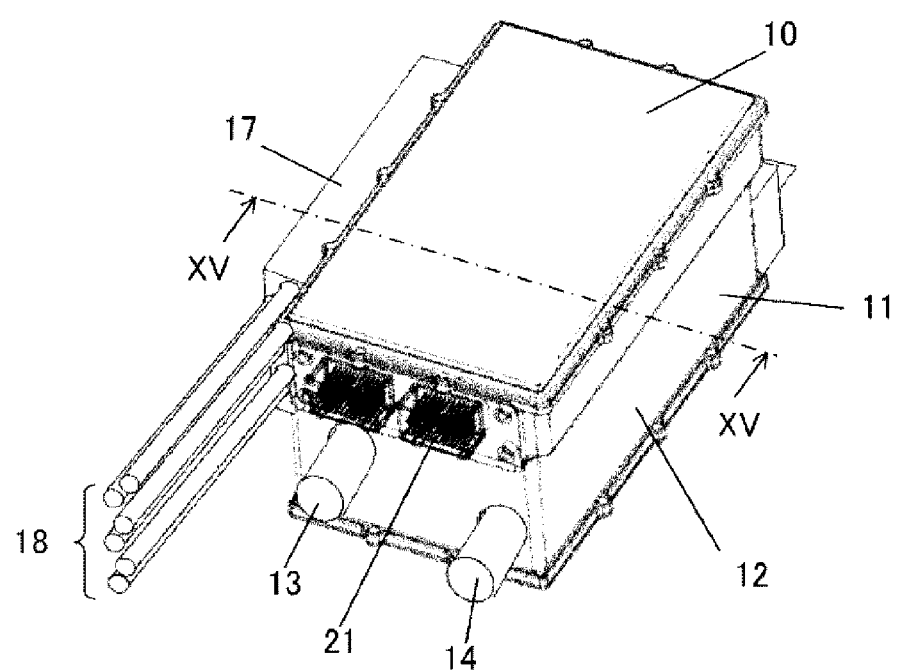
FIG. 14 is an external perspective view illustrating an example of the power conversion device illustrated in FIG. 13.
Figure 15:
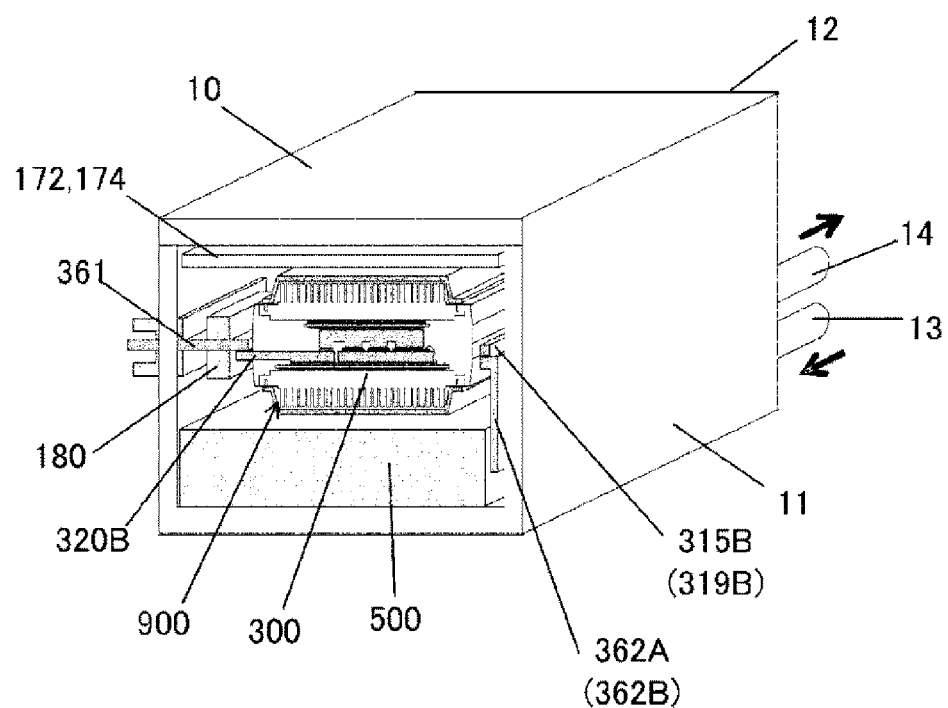
FIG. 15 is a cross-sectional view taken along line XV-XV of the power conversion device illustrated in FIG. 14.
Figure 16:
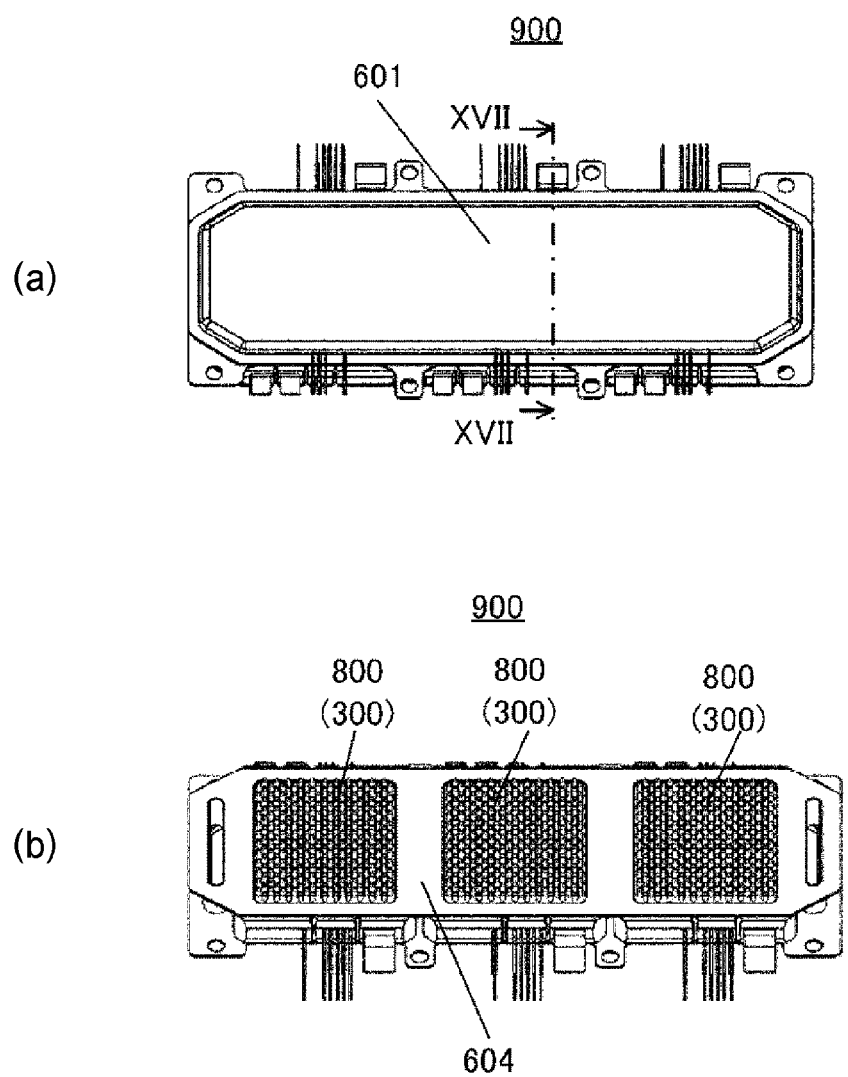
FIG. 16 illustrates a cooling flow path-provided power module illustrated in FIG. 15.
Figure 17:
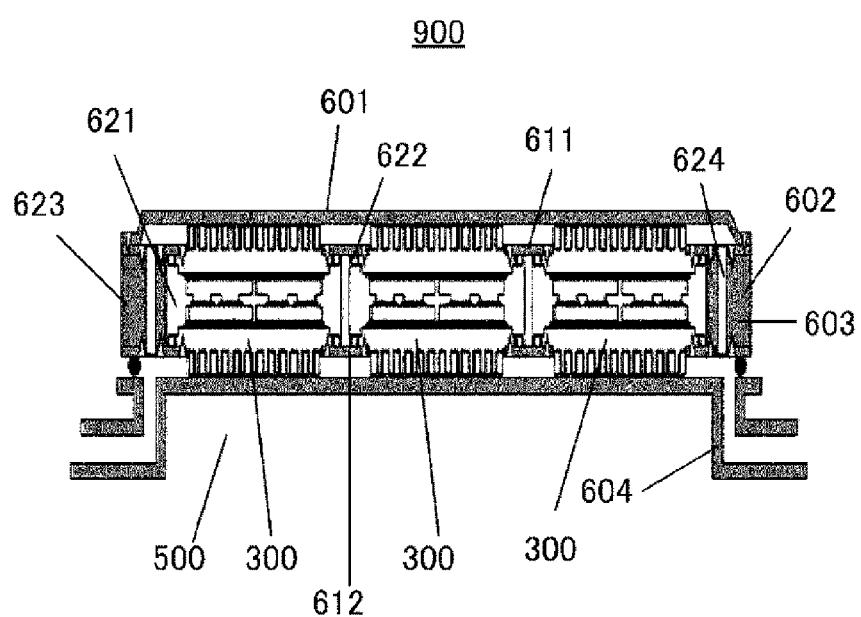
FIG. 17 is a cross-sectional view taken along line XVII-XVII in FIG. 16(a).

FIG. 14 is an external perspective view illustrating an example of the power conversion device illustrated in FIG. 13. FIG. 14 is an external perspective view illustrating an example of the power conversion device illustrated in FIG. 13. FIG. 15 is a cross-sectional view taken along line XV-XV of the power conversion device illustrated in FIG. 14. In addition, FIG. 16 illustrates a cooling flow path-provided power module illustrated in FIG. 15. FIG. 16(*a*) is a perspective view when viewed from above. FIG. 16(*b*) is a perspective view when viewed from below. FIG. 17 is a cross-sectional view taken along line XVII-XVII of FIG. 16(*a*).

The power conversion device 200 is configured to include a lower case 11 and an upper case 10, and includes a housing 12 formed in a substantially rectangular parallelepiped shape. The housing 12 internally houses the cooling flow path-provided power module 900 and the capacitor module 500 which are illustrated in FIG. 15. The cooling flow path-provided power module 900 has a cooling flow path. A cooling water inflow pipe 13 and a cooling water outflow pipe 14 which communicate with the cooling flow path protrude from one side surface of the housing 12. As illustrated in FIG. 15, the lower case 11 is open on the upper side (Z-direction), and the upper case 10 is attached to the lower case 11 by closing an opening of the lower case 11. The upper case 10 and the lower case 11 are made of aluminum alloy, and are fixed to each other in a sealed state from the outside. The upper case 10 and the lower case 11 may be integrated with each other. The housing 12 has a simple rectangular parallelepiped shape. Accordingly, the housing 12 can be easily attached to a vehicle, and can be easily produced.

A connector 17 is attached to one side surface of the housing 12 in a longitudinal direction, and an AC terminal is connected to the connector 17. In addition, a connector 21 is provided on a surface from which the cooling water inflow pipe 13 and the cooling water outflow pipe 14 are led out.

As illustrated in FIG. 15, the cooling flow path-provided power module 900 is housed inside the housing 12. The control circuit 172 and the driver circuit 174 are disposed above the cooling flow path-provided power module 900 (Z-direction), and the capacitor module 500 is housed below the cooling flow path-provided power module 900 (−Z-direction). As illustrated in FIG. 16, the cooling flow path-provided power module 900 has a 6in1 structure having three power modules 300 having the 2in1 structure. That is, the cooling flow path-provided power module 900 includes one of the inverter circuit units 140 and 142 illustrated in FIG. 13. In FIG. 16(*b*), in order to illustrate the disposition of the power module 300, the fin base 800 is illustrated through a transparent flow path forming member 604.

The AC side terminal 320B of the power module 300 penetrates the current sensor 180, and is joined to a bus bar 361. In addition, the positive electrode side terminal 315B and the negative electrode side terminal 319B which are the DC terminals of the power module 300 are respectively joined to the positive and negative electrode terminals 362A and 362B of the capacitor module 500.

In the power module 300 illustrated in FIG. 15, the AC side terminal 320B is not bent, and extends straight. In addition, the positive electrode side terminal 315B and the negative electrode side terminal 319B have a short shape that is cut on a root side.

The power conversion device 200 is produced as follows. The capacitor module 500 is housed in the lower case 11. The cooling flow path-provided power module 900 prepared in advance is housed on the capacitor module 500. The control circuit 172 and the driver circuit 174 are housed on the cooling flow path-provided power module 900. When the cooling flow path-provided power module 900 is housed, the AC side terminal 320B of each power module 300 is joined to the bus bar 361. The positive electrode side terminal 315B and the negative electrode side terminal 319B are respectively joined to the positive and negative electrode terminals 362A and 362B of the capacitor module 500. When the control circuit 172 and the driver circuit 174 are housed, the signal terminal of each power module 300 is connected to each connection terminal (not illustrated) of the control circuit 172 and the driver circuit 174. The power conversion device 200 illustrated in FIG. 14 is obtained as follows. The cooling flow path-provided power module 900, the capacitor module 500, the control circuit 172, and the driver circuit 174 are housed in the lower case 11, and thereafter, are sealed with the upper case 10.

As illustrated in FIGS. 16(a), 16(b), and 17, the cooling flow path-provided power module 900 has an elongated rectangular parallelepiped shape. The cooling flow path-provided power module 900 has a flow path cover 601 formed of iron or aluminum alloy and a flow path housing 602.

As illustrated in FIG. 17, the flow path housing 602 has an intermediate flow path member 603 and the flow path forming member 604. As illustrated in FIG. 16(b), the intermediate flow path member 603 internally houses three power modules 300 arrayed in the longitudinal direction. The intermediate flow path member 603 has an upper plate 611 and a lower plate 612 which respectively have an opening into which the power module 300 is inserted. Each power module 300 is inserted into the opening of the upper plate 611 and the lower plate 612, and is disposed so that the resin 850 is housed inside a housing space 621 provided between the upper plate 611 and the lower plate 612. In this state, the upper and lower fin bases 800 of each power module 300 are respectively joined to joining portions 622 of the upper plate 611 and the lower plate 612. The fin base 800 and the upper plate 611 or the lower plate 612 can be joined through metal joining by using a welding member or a metal fusion member.

The flow path forming member 604 has a flow path which communicates with the cooling water inflow pipe 13 and the cooling water outflow pipe 14. In the intermediate flow path member 603, a connection portion 623 which connects the upper plate 611 and the lower plate 612 to each other is provided outside the housing space 621. The connection portion 623 has a through-hole 624 penetrating in an upward-downward direction. The cooling water flowing from the cooling water inflow pipe 13 flows into the intermediate flow path member 603 from one flow path, and cools the fin base 800 on the lower side. The cooling water flows into the upper side from the through-hole 624, and cools the fin base 800 on the upper side. After cooling the fin base 800, the cooling water flows out of the cooling water outflow pipe 14 via the other flow path of the flow path forming member 604.

In this way, the cooling flow path-provided power module 900 having the 6in1 structure is formed by using three power modules 300 having the 2in1 structure. Each power module 300 causes the collector sense to accurately detect the voltage, and has the plurality of active elements 155 and 157 provided between the conductors. Therefore, it is possible to obtain the power conversion device capable of supplying large power.

According to the embodiment of the present invention, the following advantageous effects are achieved.

(1) The power module 300 includes the power module main body 301 having the first conductor 410 to which the plurality of active elements 157 configuring one of the upper and lower arm circuits are connected, and the second conductor 411 to which the plurality of active elements 155 configuring the other of the upper and lower arms are connected. In addition, the power module 300 has the AC side terminal 320B protruding from one side 301a of the power module main body 301, the positive electrode side terminal 315B and the negative electrode side terminal 319B which protrude from the other side 301b of the power module main body 301, the intermediate electrode portion 414 connecting the first conductor 410 and the second conductor 411 to each other, and the collector sense wiring 452a in which the collector electrode of the active element 157 and the first conductor 410 are connected to each other via the sense connection portion 415. The intermediate electrode portion 414 is disposed close to the active element 157 closest to the AC side terminal 320B, out of the plurality of active elements 157. The sense connection portion 415 is disposed close to the active element 157 which is farthest from the AC side terminal 320B, out of the plurality of active elements 157.

According to the above-described configuration, the sense connection portion 415 is separated from the current concentrating portion. Therefore, the voltage can be more accurately detected. In addition, the plurality of active elements 157 are respectively connected to the first conductor 410 and the second conductor 411. Therefore, a large output can be obtained.

(2) The power module 300 further includes the third conductor 412 facing the second conductor 411 with the active element 155 pinched therebetween, the fourth conductor 413 facing the first conductor 410 with the active element 157 pinched therebetween, and the collector sense wiring 452a in which the collector electrode of the active element 155 and the third conductor 412 are connected to each other via the sense connection portion 415. The sense connection portion 415 is disposed close to the active element 155 which is farthest from the positive electrode side terminal 315B and the negative electrode side terminal 319B, out of the plurality of active elements 155. According to the above-described configuration, the sense connection portion 415 is separated from the current concentrating portion. Therefore, the voltage can be more accurately detected.

(3) The plurality of active elements 157 have the element array regions 416 arrayed along the side edge 410a at an interval different from each other from the sense connection portion 415 side toward the AC side terminal 320B. The sense connection portion 415 is disposed outside the active element 155 which is farthest in the element array region 416 when viewed from the AC side terminal 320B. In this way, the sense connection portion 415 and the AC side terminal 320B are disposed to be separated from each other by at least the length of the element array region 416, and is apart from the current concentrating portion. Therefore, the voltage can be more accurately detected.

(4) The first conductor 410 has the element side region portion provided on the side of the plurality of active elements 157 in the thickness direction, and the wiring side region portion provided on the side opposite to the active element 157 side in the thickness direction. The sense connection portion 415 is connected to the wiring side region portion via the metal joining member 51, and the AC side terminal 320B is connected to the element side region portion. The sense connection portion 415 is disposed at the position apart in the thickness direction of the first conductor 410 from the upper surface to which the active element 155 of the first conductor 410 where the current concentrates is joined. Therefore, the collector sense can more accurately detect the voltage.

In the above-described embodiment, the power module main body 301 has been described as an example adopting a structure having a substantially rectangular shape in a plan view. However, the power module main body 301 can be formed into a polygonal shape in addition to a triangular shape in a plan view.

In the above-described embodiment, the power modules 300 and 900 having the 2in1 structure and the 6in1 structure in which the upper arm and the lower circuit are integrated with each other have been described as examples. However, the power modules 300 and 900 are applicable to other structures such as a 3in1 structure and a 4in1 structure. For example, the 3in1 structure has a structure in which three upper arm circuits are packaged or a structure in which three lower arm circuits are packaged. An upper arm package in which three upper arm circuits are packaged can be combined with a lower arm package in which three lower arm circuits are packaged. In this manner, a power module having a 6in1 structure can be formed.

In the above-described embodiment, a structure in which the collector side wiring board 423 having the wiring 452 including the collector sense wiring 452a is stacked on the first conductor 410 and the third conductor 412 has been described as an example. However, the collector sense wiring 452a can be integrated with the first conductor 410. Alternatively, instead of the collector sense wiring 452a, a lead member for the collector sense can be adopted. In this structure, the wiring 452 other than the collector sense wiring 452a can be adopted as a lead member. In this manner, it is possible to adopt a configuration in which the collector side wiring board 423 is unnecessary.

In the above-described embodiment, a structure in which the fin base 800 has the annular groove 802 has been described as an example. However, a structure in which the fin base 800 does not have the annular groove 802 may be adopted. In addition, a cooling structure may be formed in a case for housing the power module without providing the fin base 800.

In the above-described embodiment, a structure in which the conductor and the wiring of the wiring board, and the wiring of the wiring board and the fin plate are joined to each other via the metal joining member has been described as an example. However, instead of the joining via the metal joining member, other joining methods such as a conductive adhesive, welding, and fusion joining performed by ion beam irradiation may be used.

The present invention is not limited to the above-described embodiments and alternative techniques. Other aspects conceivable within the scope of the technical idea of the present invention are also included in the scope of the present invention.

REFERENCE SIGNS LIST 155 active element (first active element)
156 diode
157 active element (second active element)
158 diode
200 power conversion device
300 power module
301 power module main body
301a one side
301b other side
304 non-sealed module structure body
315B positive electrode side terminal
319B negative electrode side terminal
320B AC side terminal
325C collector sense signal terminal
406 AC side electrode
410 first conductor
411 second conductor
412 third conductor
413 fourth conductor
414 intermediate electrode portion
415 sense connection portion
416 element array region
417 first line segment
418 second line segment
419 third line segment
451 insulation plate
452 wiring
452a collector sense wiring
800 fin base
850 resin
900 cooling flow path-provided power module

The invention claimed is:

1. A power module having a module main body having a polygonal shape in a plan view, the power module comprising:
a plurality of first active elements configuring one of upper and lower arm circuits;
a plurality of second active elements configuring the other of the upper and lower arm circuits;
a first conductor to which a collector electrode of each of the plurality of first active elements is connected;
a second conductor to which an emitter electrode of the plurality of second active elements is connected;
an alternating current (AC) side terminal protruding from one side of the module main body;
a positive electrode side terminal and a negative electrode side terminal which protrude from the other side different from the one side of the module main body;
an intermediate electrode portion that connects the first conductor and the second conductor to each other; and
a first collector sense wiring in which the collector electrode of the first active element and the first conductor are connected to each other via a first sense connection portion,
wherein the intermediate electrode portion is disposed close to the first active element which is closest to the alternating current (AC) side terminal, out of the plurality of first active elements, and the first sense connection portion is disposed close to the first active element which is farthest from the alternating current (AC) side terminal, out of the plurality of the first active elements.

2. The power module according to claim 1, further comprising:
a third conductor facing the second conductor with the second active element pinched therebetween;
a fourth conductor facing the first conductor with the first active element pinched therebetween; and
a second collector sense wiring in which the collector electrode of the second active element and the third conductor are connected to each other via a second sense connection portion,
wherein the second sense connection portion is disposed close to the second active element which is farthest from the positive electrode side terminal and the negative electrode side terminal, out of the plurality of second active elements.

3. The power module according to claim 2,
wherein the module main body has a rectangular shape, and wherein when a straight line connecting the positive electrode side terminal and the alternating current (AC) side terminal to each other is defined as a first line segment, a straight line connecting the negative electrode side terminal and the alternating current (AC) side terminal to each other is defined as a second line segment, and a straight line connecting the first sense connection portion and the second sense connection portion to each other is defined as a third line segment, the alternating current (AC) side terminal, the first sense connection portion, and the second sense connection portion are disposed so that the third line segment intersects the first line segment and the second line segment.

4. The power module according to claim 1,
wherein the plurality of first active elements have element array regions arrayed along the one side at an interval from each other from the first sense connection portion side toward the alternating current (AC) side terminal, and
wherein the first sense connection portion is disposed outside the active element which is farthest in the element array region when viewed from the alternating current (AC) side terminal.

5. The power module according to claim 1,
wherein the first conductor has an element side region portion provided on a side of the plurality of first active elements in a thickness direction, and a wiring side region portion provided on a side opposite to the first active element side in the thickness direction, and
wherein the first sense connection portion is connected to the wiring side region portion via a metal joining member, and the alternating current (AC) side terminal is connected to the element side region portion.

6. The power module according to claim 5,
wherein the alternating current (AC) side terminal is formed integrally with the element side region of the first conductor.

7. The power module according to claim 1, wherein the first sense connection portion is provided in a collector sense wiring formed on one surface of an insulation plate.

* * * * *